(12) United States Patent
Resnick et al.

(10) Patent No.: US 7,826,996 B2
(45) Date of Patent: Nov. 2, 2010

(54) MEMORY-DAUGHTER-CARD-TESTING APPARATUS AND METHOD

(75) Inventors: David R. Resnick, Tucson, AZ (US);
Gerald A. Schwoerer, Chippewa Falls, WI (US); Kelly J. Marquardt, Eau Claire, WI (US); Alan M. Grossmeier, Chippewa Falls, WI (US); Michael L. Steinberger, Chippewa Falls, WI (US); Van L. Snyder, Eau Claire, WI (US); Roger A. Bethard, Chippewa Falls, WI (US)

(73) Assignee: Cray Inc., Seattle, WA (US)

( * ) Notice: Subject to any disclaimer, the term of this patent is extended or adjusted under 35 U.S.C. 154(b) by 418 days.

(21) Appl. No.: 11/679,175

(22) Filed: Feb. 26, 2007

(65) Prior Publication Data

US 2008/0059105 A1 Mar. 6, 2008

Related U.S. Application Data

(62) Division of application No. 10/850,044, filed on May 19, 2004, now Pat. No. 7,184,916.

(60) Provisional application No. 60/472,174, filed on May 20, 2003.

(51) Int. Cl.
*G01C 31/00* (2006.01)
*G06F 11/00* (2006.01)

(52) U.S. Cl. .................. 702/118; 702/188; 702/189; 702/190

(58) Field of Classification Search ......... 702/118–123, 702/180–189; 714/733–735, 738; 711/115; 710/305; 324/754
See application file for complete search history.

(56) References Cited

U.S. PATENT DOCUMENTS

| 4,319,357 A | 3/1982 | Bossen |
| 4,384,348 A | 5/1983 | Nozaki |
| 4,394,763 A | 7/1983 | Nagano et al. |
| 4,667,330 A | 5/1987 | Kumagai |
| 4,757,503 A | 7/1988 | Hayes et al. |

(Continued)

FOREIGN PATENT DOCUMENTS

EP    0 441 088    8/1991

(Continued)

*Primary Examiner*—Eliseo Ramos Feliciano
*Assistant Examiner*—Phuong Huynh
(74) *Attorney, Agent, or Firm*—Charles A. Lemaire; Lemaire Patent Law Firm, P.L.L.C.

(57) ABSTRACT

A memory daughter card (MDC) is described, having a very high-speed serial interface and an on-card MDC test engine that allows one MDC to be directly connected to another MDC for testing purposes. In some embodiments, a control interface allows the test engine to be programmed and controlled by a test controller on a test fixture that allows simultaneous testing of a single MDC or one or more pairs of MDCs, one MDC in a pair (e.g., the "golden" MDC) testing the other MDC of that pair. Other methods are also described, wherein one MDC executes a series of reads and writes and other commands to another MDC to test at least some of the other card's functions, or wherein one port executes a series of test commands to another port on the same MDC to test at least some of the card's functions.

20 Claims, 9 Drawing Sheets

U.S. PATENT DOCUMENTS

| | | | |
|---|---|---|---|
| 4,782,486 A | 11/1988 | Lipcon et al. | |
| 4,888,773 A | 12/1989 | Arlington et al. | |
| 5,200,963 A | 4/1993 | Chau et al. | |
| 5,267,242 A | 11/1993 | Lavallee et al. | |
| 5,274,648 A | 12/1993 | Eikill et al. | |
| 5,274,765 A * | 12/1993 | Le Gallo | 710/64 |
| 5,278,839 A | 1/1994 | Matsumoto et al. | |
| 5,357,621 A | 10/1994 | Cox | |
| 5,400,342 A | 3/1995 | Matsumura et al. | |
| 5,406,565 A | 4/1995 | MacDonald | |
| 5,430,859 A * | 7/1995 | Norman et al. | 711/103 |
| 5,495,491 A | 2/1996 | Snowden et al. | |
| 5,502,814 A | 3/1996 | Yuuki et al. | |
| 5,533,194 A | 7/1996 | Albin et al. | |
| 5,537,564 A | 7/1996 | Hazanchuk et al. | |
| 5,745,508 A | 4/1998 | Prohofsky | |
| 5,751,728 A | 5/1998 | Katanosaka | |
| 5,774,646 A | 6/1998 | Pezzini et al. | |
| 5,787,101 A | 7/1998 | Kelly | |
| 5,822,265 A | 10/1998 | Zdenck | |
| 6,226,766 B1 | 5/2001 | Harward | |
| 6,229,727 B1 | 5/2001 | Doyle | |
| 6,285,962 B1 | 9/2001 | Hunter | |
| 6,434,648 B1 | 8/2002 | Assour et al. | |
| 6,463,001 B1 | 10/2002 | Williams | |
| 6,640,321 B1 | 10/2003 | Huang et al. | |
| 6,658,610 B1 | 12/2003 | Chai et al. | |
| 6,779,128 B1 | 8/2004 | Gale et al. | |
| 6,796,501 B2 | 9/2004 | Omet | |
| 6,879,530 B2 | 4/2005 | Callaway et al. | |
| 6,898,101 B1 | 5/2005 | Mann | |
| 6,901,541 B2 | 5/2005 | Antosh et al. | |
| 6,944,694 B2 | 9/2005 | Pax | |
| 7,073,112 B2 | 7/2006 | Chai et al. | |
| 7,088,713 B2 | 8/2006 | Battle et al. | |
| 2002/0116668 A1 | 8/2002 | Chhor et al. | |
| 2005/0053057 A1 | 3/2005 | Deneroff et al. | |

FOREIGN PATENT DOCUMENTS

| | | |
|---|---|---|
| EP | 0 849 743 B1 | 3/2003 |
| JP | 2003015966 | 1/2003 |

* cited by examiner

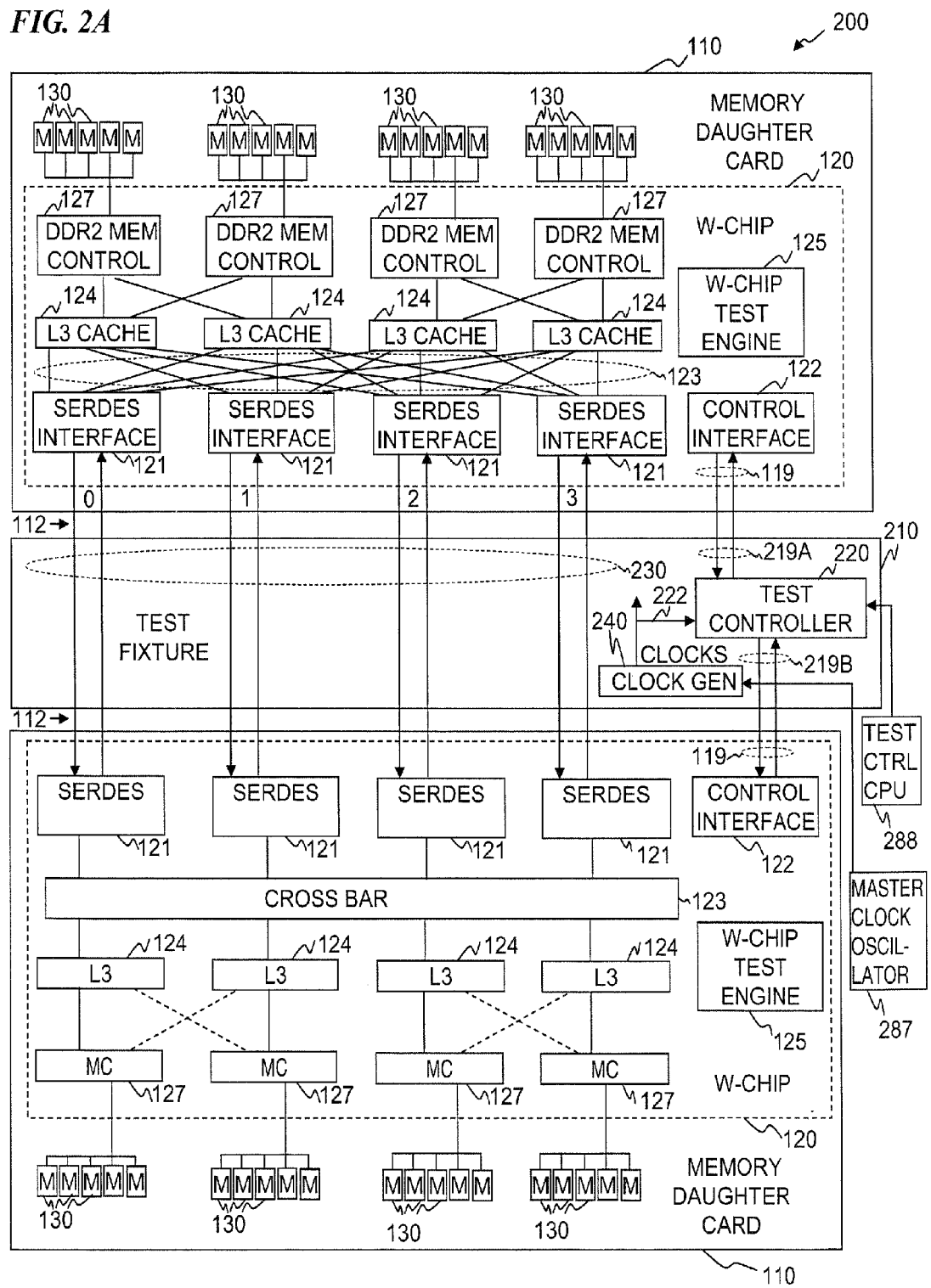

US 7,826,996 B2

MEMORY-DAUGHTER-CARD-TESTING APPARATUS AND METHOD

RELATED APPLICATIONS

This is a divisional of U.S. patent application Ser. No. 10/850,044 titled "APPARATUS AND METHOD FOR TESTING MEMORY CARDS" filed May 19, 2004 (now U.S. Pat. No. 7,184,916), which claimed benefit under 35 U.S.C. 119(e) to U.S. Provisional Application Ser. No. 60/472,174, entitled "APPARATUS AND METHOD FOR TESTING MEMORY CARDS", filed May 20, 2003, each of which is herein incorporated in its entirety by reference.

This application is also related to: U.S. patent application Ser. No. 10/850,057 entitled "APPARATUS AND METHOD FOR MEMORY WITH BIT SWAPPING ON THE FLY AND TESTING" filed on May 19, 2004 (now U.S. Pat. No. 7,320,100), which claimed benefit of U.S. Provisional Patent Application No. 60/472,174 filed on May 20, 2003, titled "APPARATUS AND METHOD FOR TESTING MEMORY CARDS," and to U.S. patent application Ser. No. 11/558,450 titled "APPARATUS AND METHOD FOR MEMORY READ-REFRESH, SCRUBBING AND VARIABLE-RATE REFRESH" filed on Nov. 10, 2006 (which is a divisional of U.S. patent application Ser. No. 10/850,057);

U.S. patent application Ser. No. 11/558,452 titled "APPARATUS AND METHOD FOR MEMORY ASYNCHRONOUS ATOMIC READ-CORRECT-WRITE OPERATION" filed on Nov. 10, 2006 (now U.S. Pat. No. 7,676,728) (which is also a divisional of U.S. patent application Ser. No. 10/850,057); and U.S. patent application Ser. No. 11/558,454 titled "APPARATUS AND METHOD FOR MEMORY BIT-SWAPPING-WITHIN-ADDRESS-RANGE CIRCUIT" filed on Nov. 10, 2006 (now U.S. Pat. No. 7,565,593) (which is also a divisional of U.S. patent application Ser. No. 10/850,057); each of which is incorporated herein in its entirety by reference.

FIELD OF THE INVENTION

This invention relates to the field of computer memories, and more specifically to a method and apparatus for testing a computer memory, for example one implemented on a card in which additional logic functions on the card make direct access to the memory parts themselves difficult or impossible, and for testing memory-card logic in which the normal data paths do not support easy, low-cost test access.

BACKGROUND OF THE INVENTION

Modern computer systems require faster, more sophisticated, and larger capacity memory, often provided on daughter cards such as DIMMs (dual-inline memory modules) having a plurality of memory chips per daughter card. As system performance keeps increasing, it is difficult and expensive to connect enough memory parts more or less directly to the processor or its interface ICs. Electrical issues and pin limitations push memory system design in directions that put the memory controller(s) on the memory cards and also push the card interface to have higher data rates per pin in order to reduce the number of pins while keeping the card bandwidth in line with the higher performance needs of the attached processors and of the bandwidth of the memory components on the memory cards. A memory card design that adopts this direction has test issues, in that the memory components (the chips) are not directly accessible for testing as is normal in past industry practice, and the data rates of the high-speed interfaces are too fast for connection to testers that are available in normal production testing. While special purpose test equipment can be built and used, the design of special-purpose memory testers is very expensive and time consuming.

Thus, there is a need for improved testing methods and apparatus for new memory cards and for logic functions in which test access is 'hidden' behind high speed interfaces.

SUMMARY OF THE INVENTION

The present invention provides a memory daughter card (MDC) having one or more (likely multiple) very high-speed serial interface(s), optionally an on-card L3 cache, and an on-card MDC test engine that allows one MDC to be directly connected to another MDC, or to itself, for testing purposes. In some embodiments, a control interface, such as a JTAG interface and/or a Firewire channel, allows the test engine to be programmed and controlled by a test controller on a test fixture that allows a single card to be tested, or simultaneous testing of one or more pairs of MDCs, one MDC in a pair (the "golden" MDC) testing the other MDC of that pair.

A method is also described, wherein one MDC executes a series of reads and writes (and optionally other commands) to another MDC to test at least some of the (and ideally, most or all of) other card's functions. A method is also described, wherein one port of an MDC executes a series of reads and writes (and optionally other commands) to another port of the same MDC to test at least some of the (and ideally, most or all of) the card's functions.

It is to be understood that a memory "card" includes any suitable packaging, including printed circuit card, ceramic module, or any other packaging that holds a plurality of memory chips along with some or all of the circuitry described herein. In some embodiments, a "card" would include a single integrated-circuit chip having both the memory and some or all of the circuitry described herein.

BRIEF DESCRIPTION OF THE DRAWINGS

FIG. 2A is a block diagram of a memory-card testing system 200 of some embodiments of the invention.

DESCRIPTION OF PREFERRED EMBODIMENTS

In the following detailed description of the preferred embodiments, reference is made to the accompanying drawings that form a part hereof, and in which are shown by way of illustration specific embodiments in which the invention may be practiced. It is understood that other embodiments may be utilized and structural changes may be made without departing from the scope of the present invention.

The leading digit(s) of reference numbers appearing in the Figures generally corresponds to the Figure number in which that component is first introduced, such that the same reference number is used throughout to refer to an identical component which appears in multiple Figures. Signals and connections may be referred to by the same reference number or label, and the actual meaning will be clear from its use in the context of the description.

Figure 1A:
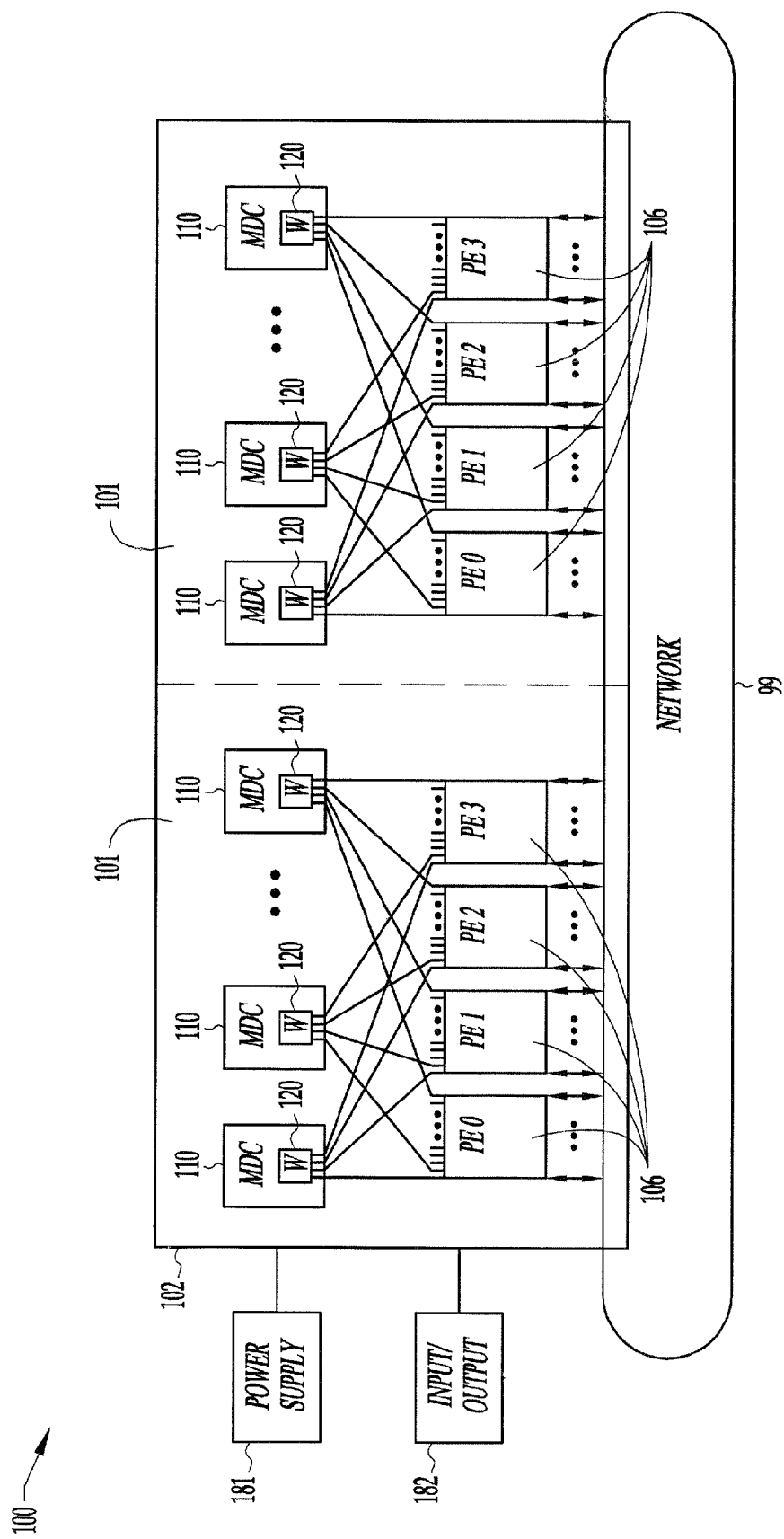
FIG. 1A is a block diagram of a computer system 100 of some embodiments of the invention.

FIG. 1A is a block diagram of a computer system 100 of some embodiments of the invention. Computer system 100 includes an interconnection network 99 that is connected to a plurality of boards 102, each board having one or more nodes 101 (for example one or two nodes 101 per board 102), each node 101 having one or more processing elements 106 (for example, four processing elements are used in some embodiments), each node 101 having one or more memory daughter cards (MDCs) 110 (for example, up to thirty-two MDCs 110 per node 101, in some embodiments). In some embodiments, a node controller, router, and interconnection scheme such as described in U.S. patent application Ser. No. 09/407,428 filed Sep. 29, 1999 and entitled "MULTIPROCESSOR NODE CONTROLLER CIRCUIT AND METHOD" is used with node 101. In some embodiments, each PE 106 has six connections to network 99 (e.g., a multi-dimensional network, two each in each of three directions, for example, which can be used to form a torus interconnection), while in other embodiments, other numbers of connections are made to construct different network topologies. In typical systems, a power supply system 181 supplies power, and an input/output system 182 provides data input and output, such as to and from disk and/or tape storage devices, and/or user consoles. Some embodiments of the invention include one or more methods to perform the functions described for the invention. In some embodiments, a computer-readable medium 183 (that is connectable, for example, to I/O system 182) has instructions stored thereon for causing system 100 to perform the method(s) according to various embodiments of the invention.

Figure 1B:
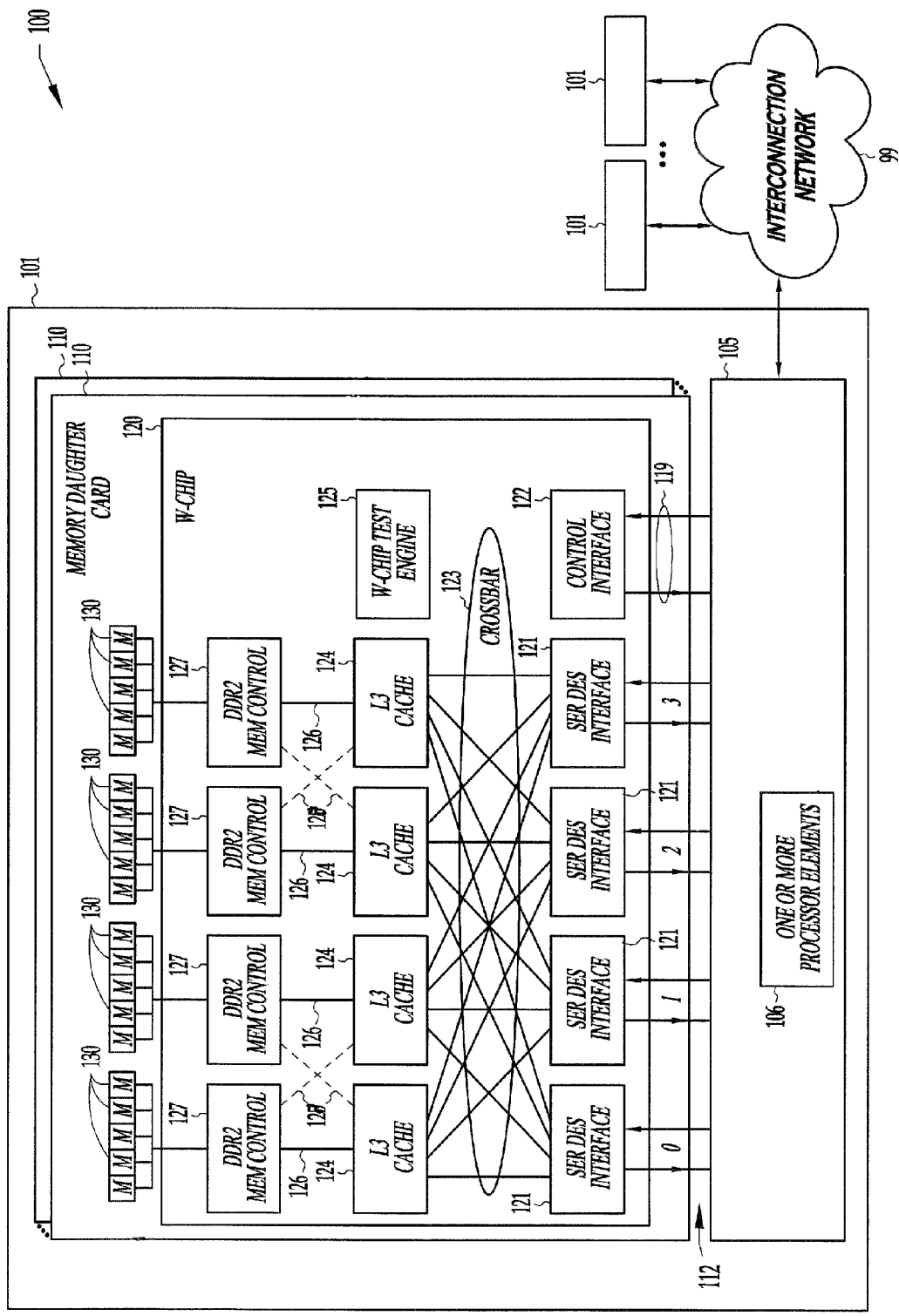
FIG. 1B is a block diagram of a computer system 100 of some embodiments of the invention.

FIG. 1B is a block diagram of another embodiment of computer system 100 of some embodiments of the invention. Computer system 100 includes an interconnection network 99 that is connected to a plurality of nodes 101, each node 101 having a processor group 105 having one or more processing elements 106 (for example, four processing elements are used in some embodiments), each node 101 having to one or more memory daughter cards (MDCs) 110 (for example, up to thirty-two MDCs 110 per node 101, in some embodiments). In some embodiments, all of the MDCs 110 of a node are each connected to all of the processors 106 of that node (e.g., in some embodiments, each of the four ports 121 of each MDC 110 is connected to a different one of the processors 106).

In some embodiments, each MDC 110 includes a single W-chip 120 (i.e., a circuit 120, which, in some embodiments, is implemented on a single chip (and, in some embodiments, includes other circuitry and/or functions than described herein)), but in other embodiments, circuit 120 is implemented using more than one chip, but is designated herein as W-chip or circuit 120) having a high-speed external card interface 112, which in turn includes a plurality of SerDes (serializer-deserializer) ports 121 (for example, four SerDes ports 121 per MDC 110 are used in some embodiments). A crossbar switch 123 connects each SerDes port 121 to each one of a plurality of L3 caches 124 (for example, four L3 caches 124 per MDC 110 are provided in some embodiments). In some embodiments, each L3 cache 124 is tied by connection 126 to a corresponding DDR2 memory controller 127. In some embodiments, an additional "degrade capability" connection 128 is provided between each L3 cache 124 and a neighboring DDR2 memory controller 127. In some embodiments, each DDR2 memory controller 127 controls a memory or memory portion 130 having five eight-bit-wide DDR2 memory-chip groups 130 (for example, each chip group 130 having one memory chip, or having two or more stacked chips). This provides each DDR2 memory controller 127 with a forty-bit-wide data path, providing 32 data bits, seven ECC (error-correction code) bits, and a spare bit.

In some embodiments, the individual memory components of the memory-chip group(s) 130 conform to the emerging JEDEC Standards Committee DDR2 SDRAM Data Sheet Revision 1.0 Specification JC 42.3 (JESD79-2 Revision 1.0) dated Feb. 3, 2003 or subsequent versions thereof. In other embodiments, conventional, readily available DDR chips are used. In yet other embodiments, any suitable memory-chip technology (such as Rambus™, SDRAM, SRAM, EEPROM, Flash memory, etc.) is used for memory chip-groups 130.

The W-chip 120 also includes a control interface 122 (some embodiments use a JTAG-type boundary scan circuit for control interface 122; some embodiments further use Firewire (IEEE Standard 1394) channel for the off-card interface 119 to control interface circuit 122). In some embodiments, the Firewire interface is built into W-chip 120, while in other embodiments, the Firewire interface is built on a separate chip on MDC 110, and connects to a JTAG interface provided by control interface 122. Control interface 122 provides the mechanism to set bit patterns in configuration registers (for example, some embodiments use memory-mapped registers (MMRs)) that hold variables that control the operation of W-chip 120.

The present invention also provides circuitry that allows one MDC 110 to test another MDC 110, in some embodiments, or to test itself, in some embodiments. In some embodiments, this circuitry is implemented as a W-chip test engine (WTE) 125 having a microcode sequence, described further below.

FIG. 2A is a block diagram of a memory-daughter-card testing system 200 of some embodiments of the invention. In some embodiments, MDC testing system 200 includes a test fixture 210 having two or more MDCs 110 plugged into it. Connections 230 couple each output of each SerDes port 121 to a corresponding input of a SerDes port 121 on another MDC 110, thus allowing the test to run each MDC at full speed through its normal read/write interface. The test fixture 210 provides clocks 222 from clock generator 240 (e.g., high-speed differential clocks) used by the MDCs 110, and also includes a test controller 220 that programs one or the other or both WTEs 125 (e.g., through its ports 219A and 219B coupled to the respective ports 119 to control interfaces 122). In some embodiments, test controller 220 sets up one MDC 110 (for example, the lower one) as the tester card wherein its WTE 125 runs the memory tests, and sets up the other MDC 110 (for example, the upper one) as the unit-under-test (UUT) wherein it is configured in the normal read/write memory card mode (as if it were in system 100 of FIG. 1A). Thus, the lower WTE 125 sets up data patterns in its memory-chip groups 130 at the bottom of FIG. 2A), and then controls the writing of these patterns out the SerDes port 121 of the lower MDC 110, and thus into the SerDes of the upper MDC 110, and into that MDC's caches 124 and memory-chip groups 130. These data patterns are then read back the opposite way (or, in some embodiments, the UUT itself checks read operands from the memory being tested), and compared by WTE 125 in the lower MDC 110. When each test is complete, the results are transferred back to test controller 220 for analysis and use in accepting, rejecting, or reconfiguring the UUT MDC 110.

In some embodiments, such a configuration allows a large variety of debug activities to be performed that are not available on simpler setups that run a large number of tests, but generate only a pass-fail result, such as checking a checksum value after a large number of tests were run. The ability to load microcode having newly devised tests allows intricate debug to be performed, even when the high-speed interfaces (SerDes ports 121, for example) are run at full speed.

Figure 2B:
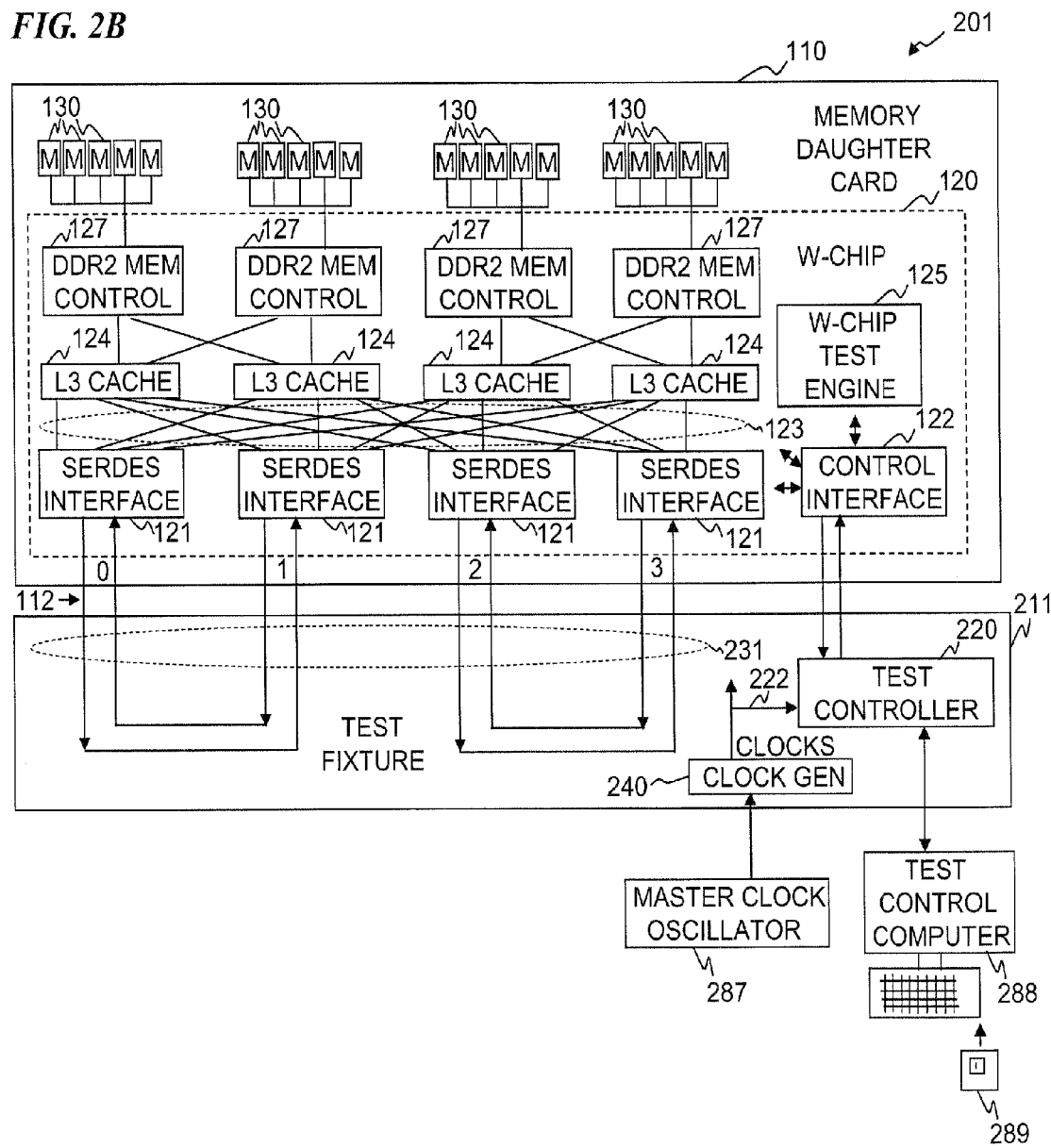
FIG. 2B is a block diagram of a memory-card testing system 201 of some embodiments of the invention.

FIG. 2B is a block diagram of a memory-daughter-card testing system 201 of some embodiments of the invention. In some embodiments, MDC testing system 201 includes a test fixture 211 having a single MDC 110 plugged into it. Connections 231 couple each output of a subset of SerDes ports 121 to a corresponding input of another SerDes port 121 on the same MDC 110, and the test controller's control port 219 is connected to the MDC's port 119 of control interface 122, thus allowing the test to run the MDC at full speed through its normal read/write interface.

In some embodiments, the test fixture 211 (which is similar to fixture 210 of FIG. 2A, except that loop-back connections are made in the test fixture 211 between ports 0 and 1, and ports 2 and 3 of MDC 110) provides clocks 222 (e.g., high-speed differential clocks) used by the MDCs 110, and also includes a test controller 220 that programs the single WTE 125. In other embodiments, one or both MDCs 110 generates its own clocks for its transmitter, which clocks are then received and used by the other MDC 110.

In some embodiments, test controller 220 sets up one or more SerDes ports 121 (for example, port 0 and port 2) as the tester port(s) wherein WTE 125 runs the memory tests out those ports and receives results back into those ports), and sets up the other ports 121 (for example, ports 1 and 3) as the unit-under-test (UUT) ports wherein they are configured in the normal read/write memory card mode (as if it were in system 100 of FIG. 1A). Thus, in some embodiments, the even-numbered ports set up data patterns in their respective memory-chip groups 130, and then controls the writing of these patterns out the even-numbered SerDes port 121, and thus into the odd-numbered SerDes port 121 next to them, and into those port's caches 124 and memory-chip groups 130. These data patterns are then read back the opposite way, and compared by WTE 125. When each test is complete, the results are transferred back to test controller 220 for analysis and use in accepting, rejecting, or reconfiguring the UUT MDC 110. This way of testing allows the tests to cover the complete data path from the memories to the edge of the card. Further, only the single MDC 110 is required for the test.

In some embodiments, a test-control computer 288 is provided to drive test controller 220, and to receive results for display, transmission, or storage. In some embodiments, a computer-readable storage medium 289 (such as diskette, CDROM) is used to provide the control program data that is loaded into microcode memory 310 of FIG. 3B, described below. This control program data provides the data and control flow to allow, e.g., one MDC 110 to test another MDC 110. In some embodiments, an external master clock oscillator 287 provides a source signal for clock generator 240.

Figure 2C:
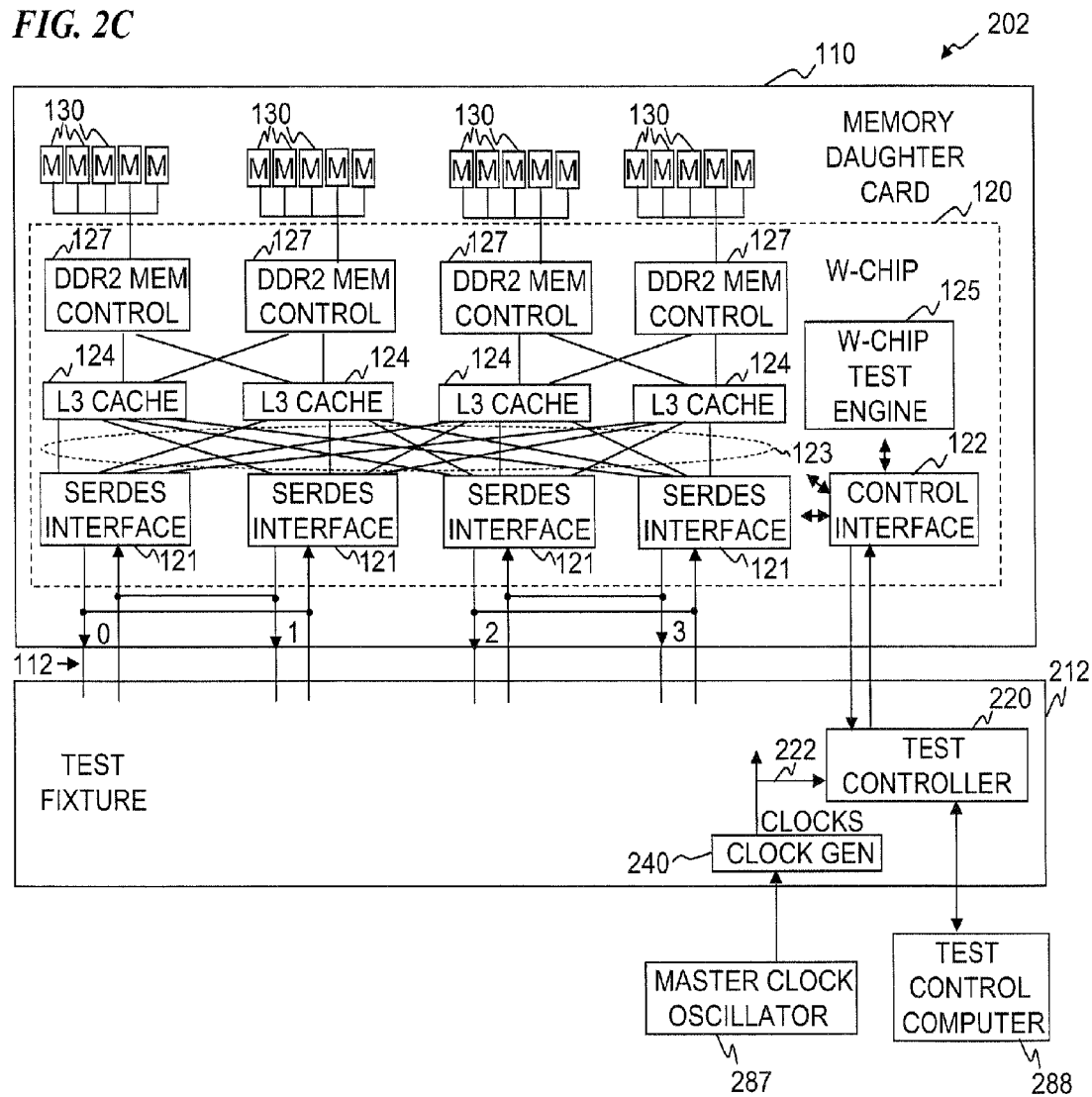
FIG. 2C is a block diagram of a memory-card testing system 202 of some embodiments of the invention.

FIG. 2C is a block diagram of a memory-daughter-card testing system 202 of some embodiments of the invention. In some embodiments, MDC testing system 202 includes a test fixture 212 (which is similar to fixture 211 of FIG. 2B, except no electrical connections are made in the test fixture 211 to ports 0, 1, 2 and 3 of MDC 110) having a single MDC 110 plugged into it. Connections (in some embodiments, these are programmably connectable by microcoding WTE 125) are configured on board the MDC 110, rather than in the test fixture as was the case for FIGS. 2B and 2A. In other embodiments, the connections are physically wired (e.g., by card traces, jumpers or soldered "blue wires" that are later removed or cut (for example, by a laser or other suitable method) for normal operation of the card (thus making the test card temporarily not quite exactly identical to the normally operating card). These on-card connections couple each output of a subset of SerDes ports 121 to a corresponding input of another SerDes port 121 on the same MDC 110, thus allowing the test to run the MDC at full speed through its normal read/write interface. Although, this does not allow the testing to the card edge as was the case for FIG. 2B, in other ways the operation of FIG. 2C is the same as for FIG. 2B.

Figure 2D:
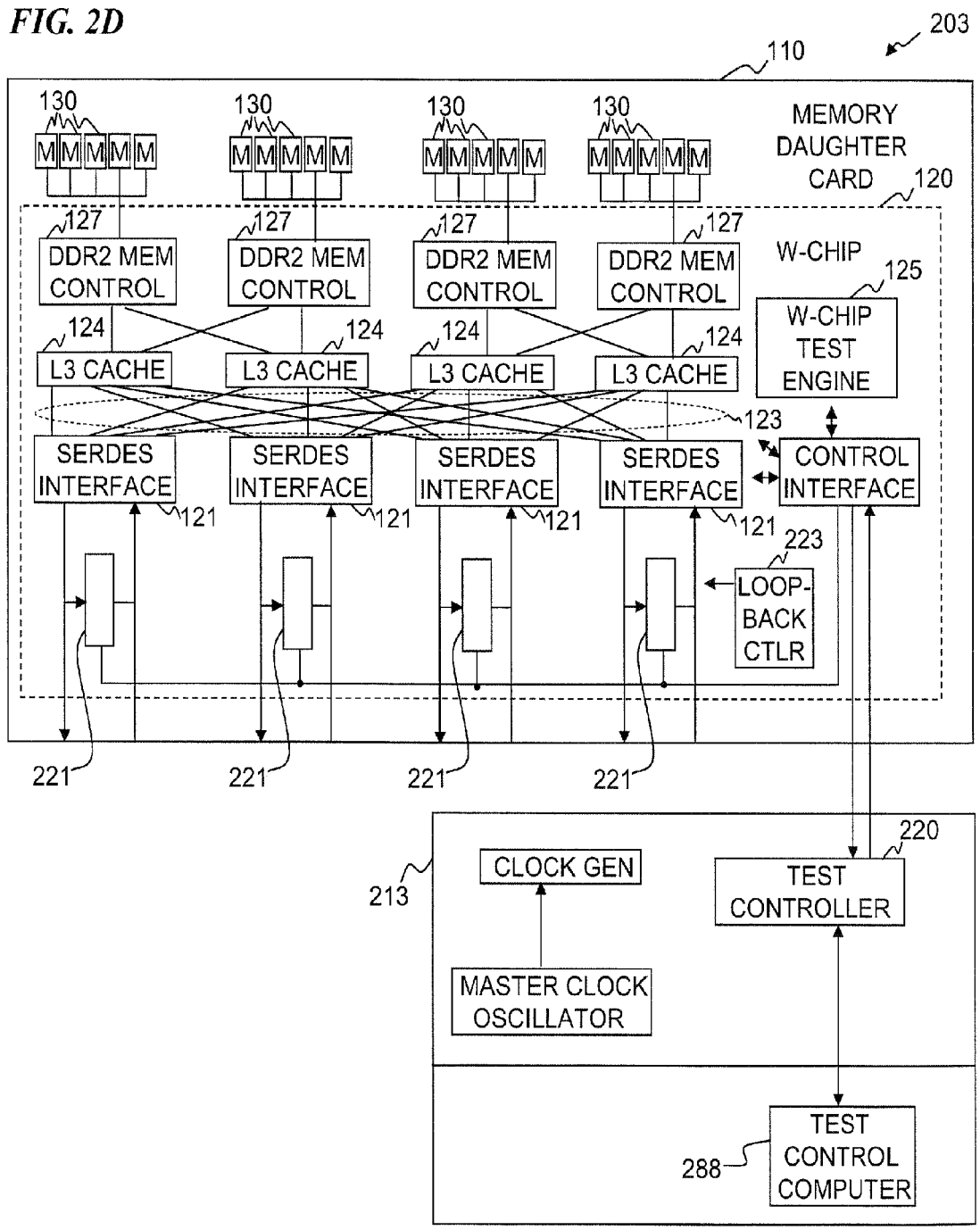
FIG. 2D is a block diagram of a memory-card testing system 203 of some embodiments of the invention.

FIG. 2D shows a similar system 203 having local SerDes Connections, connected by gates 221 under the control of loop-back controller 223 as directed by WTE 125, in some embodiments, within the integrated circuit (IC) that allow local testing of the SerDes functions before the IC is mounted on the MDC and afterward. The output of each port 121 is returned to the input of the same port within W-chip 120. In some embodiments, no actual connections to the high-speed serial ports need to be made to the test fixture 213. In some embodiments, MDC testing system 203's test fixture 213 (which is similar to fixture 211 of FIG. 2B, except no electrical connections are made in the test fixture 211 to ports 0, 1, 2 and 3 of MDC 110) has one or more MDCs 110 plugged into it.

Figure 3A:
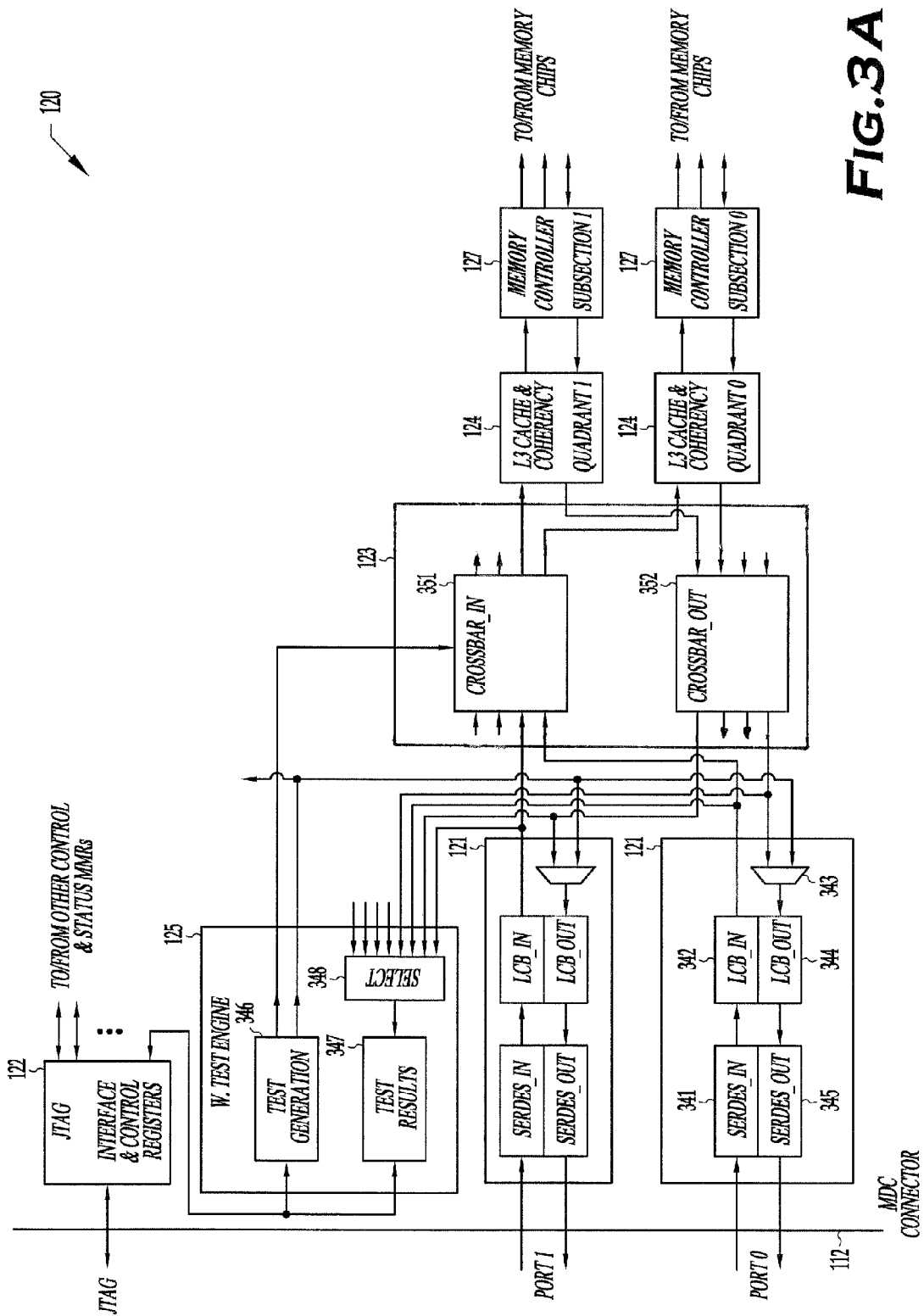
FIG. 3A is a block diagram of a portion of W-chip 120 of some embodiments of the invention.

FIG. 3A is a block diagram of a portion of W-chip 120 of some embodiments of the invention, showing more detail than is shown in FIG. 1A. In some embodiments, W-chip 120 includes a control interface 122 (for example, a JTAG-type scan-register interface and associated control registers), a WTE 125, a crossbar 123 that connects each of four SerDes ports 121 (two are shown here) to each of four L3 caches 124 (two are shown here), which are in turn coupled to a corresponding memory controller 127 (two of four are shown here). WTE 125 includes a test generation component 346 and a test results component 347 that compares results obtained by selection circuitry 348 that obtains results from the SerDes-in sections 341 or the crossbar-out sections 352. Each port 121 includes a SerDes-in 341 portion that feeds a corresponding Link Control Block-in (LCB-in) circuit 342, and a multiplexer (selector) 343 that obtains data from test generator 346, and crossbar-out circuit 352 and selects one of those to feed to LCB-out circuit 344 and then to SerDes-out portion 345. The crossbar-in portion 351 obtains data from each input port (i.e., from the output of its LCB-in 342) and directs that data to one of the four L3 caches 124. The crossbar-out portion 352 obtains data from one of the four L3 caches 124, and directs that data to one of the four output ports 121 (i.e., to the input of its LCB-out 344 through its selector 343).

In some embodiments, the cache quadrants 124 each drive separate memory controllers 127. In turn, each memory controller drives a set of memory chips 130.

Figure 3B:
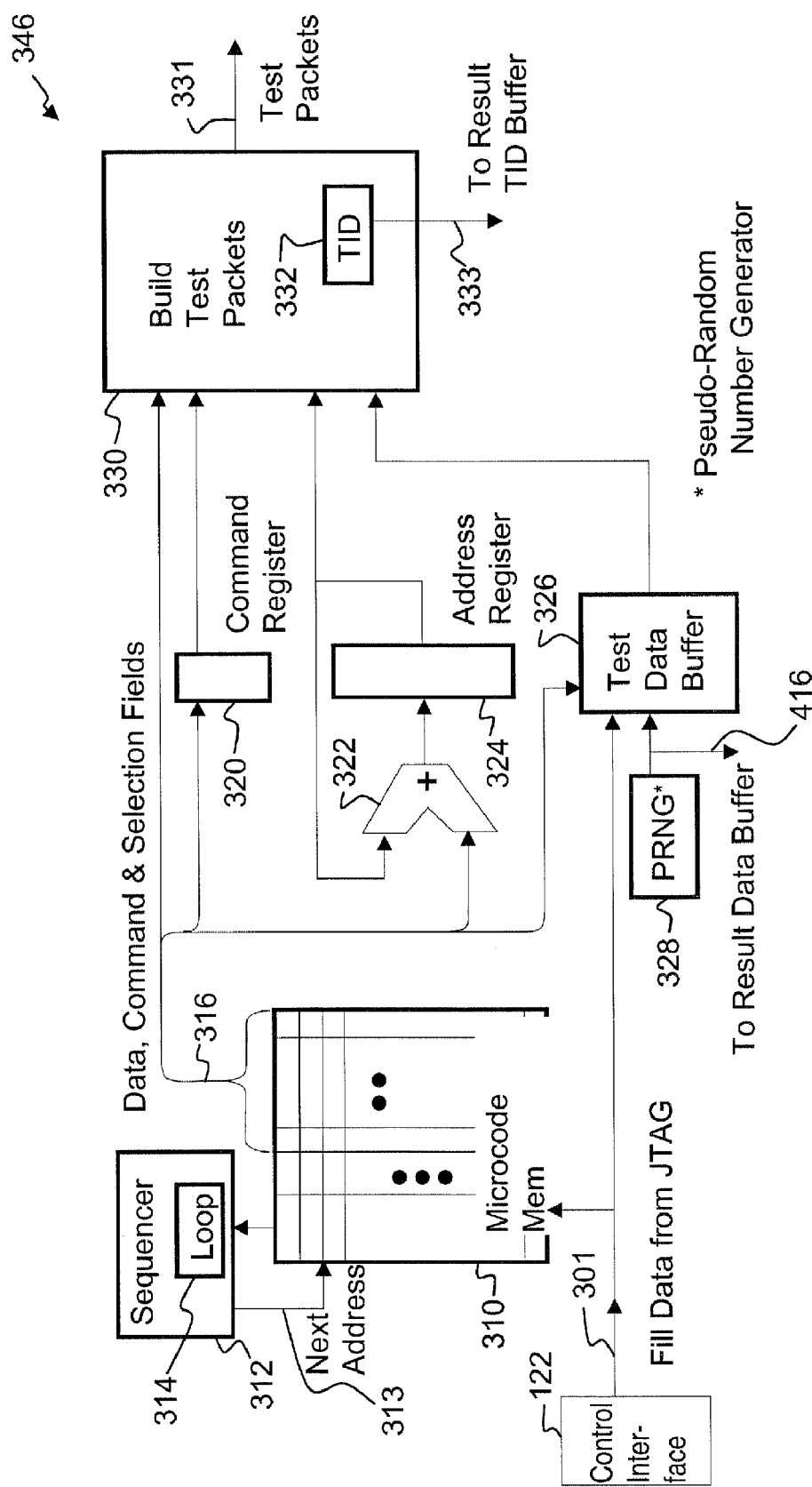
FIG. 3B is a block diagram of a test-engine processor 346 of some embodiments of the invention.

FIG. 3B is a block diagram of a test-engine processor 346 of some embodiments of the invention. Test-engine processor 346 provides test generation functions for WTE 125. Programming and data patterns 301 are sent from test controller 220 (see FIG. 1B) through control interface 122, and delivered to microcode memory 310 and test data buffer 326. Some embodiments include a pseudo-random number generator 328 that provides pseudo-random numbers as source test operands to test data buffer 326 and to the expected-result-data buffer 428 (see FIG. 4) instead of loading tests from the control interface 122. Microcode memory 310 provides instructions 316 in a manner programmed into the control words stored there and sequenced by sequencer 312 that includes a loop counter/controller 314, and that generates each next address 313 (e.g., sequential execution, looping, branching, etc.). Instructions 316 also include data, command, and selection fields to test data buffer 326, address register 324 and its address adder 322, command register 320, and build-test-packet controller 330. Build-test-packet controller 330 in turn receives commands from command register 320, addresses from address register 324, and data (i.e., patterns to be written, read, and compared) from test data buffer 326. Build-test-packet controller 330 sends test packets 331 to the crossbar-in 351, which forwards them the L3 cache 124 or the memory controllers 127 and then the memory 130 on the tester MDC 110, and sends TIDs (Transaction IDentifiers) to the result-data indexes buffer 422 (see FIG. 4). The test controller 125 can also send test data to the 343 multiplexers and thence to the SerDes ports 121.

Figure 4:
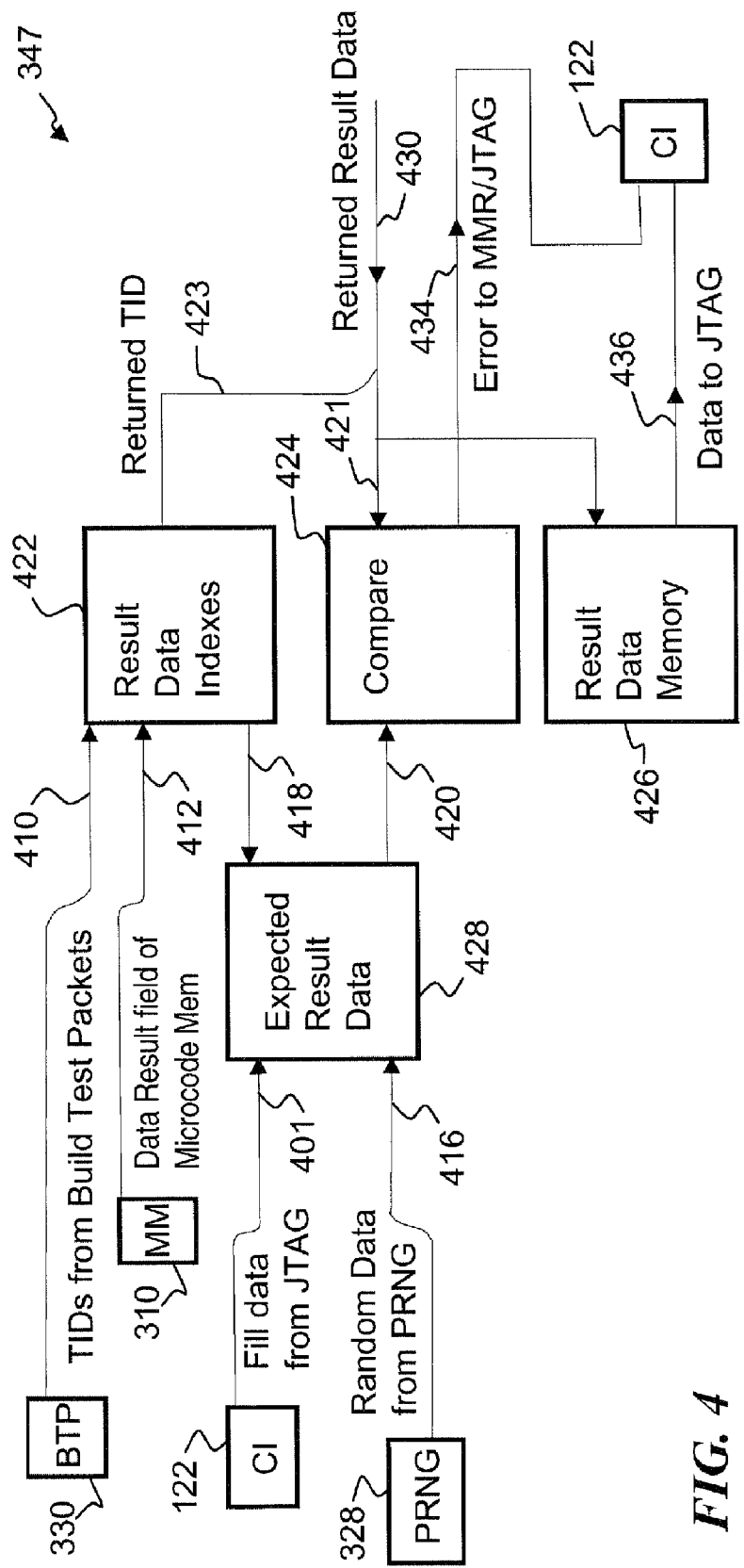
FIG. 4 is a block diagram of a test-engine test-result checker 347 of some embodiments of the invention.

FIG. 4 is a block diagram of a test-engine test-result checker (TETRC) 347 of some embodiments of the invention. TETRC 347 includes an expected-result-data buffer 428 that receives fill data 401 from JTAG control interface 122 (see FIG. 1B), pseudo-random data 416 from pseudo-random number generator 328, and result data indexes 418 an address that is used to read expected result data items from result-data indexes buffer 422, and sends operands for comparison operations performed by compare circuit 424. In other words, the TID (transaction ID) is used as an address into the result data indexes buffer 422, and obtains a pointer 418 that points to an entry having the comparison data in expected result data buffer 428. Result-data indexes buffer 422 receives TIDs from build-test-packet controller 330, data results field data 412 from microcode memory 310, and returned TID data 430 test results selected through multiplexer 348 (see FIG. 3A) from the UUT MDC 110; result-data indexes buffer 422 provides the pointer 418 corresponding to the input TID as an operand (index to retrieve data pattern) to expected-result-data buffer 428. Thus, each TID 410 corresponds to a particular data pattern, and the returned results data includes a TID 423 and data pattern 421, which are correlated by the circuitry such that compare circuit receives the expected data 420 and the returned result data 421 in a time sequence that allows the proper data to be compared, and if the data does not compare properly, and error indication 434 is provided to control interface 122. In some embodiments, a result-data memory 426 provides storage for a series of results that are delivered as data 436 to JTAG control interface 122.

Thus, the memory daughter card (MDC) 110 for computer system 100 is very different from conventional memory cards designed and used previously in the computer industry. MDC 110 does not provide direct access to the memory parts on the card from the card's connector, but instead it receives commands and functional requests through four high-speed ports 121 that can not easily be connected to, or functionally tested by, general-purpose testers or conventional memory testers. This means that test capability of the card must be designed into the card as part of the design process and, in some embodiments, needs to interact with and accept test requirements of the vendor or vendors that will manufacture the card. This invention describes the basic test requirements and capabilities in support of all aspects of making and using a MDC 110: in card manufacturing and test, in initial system debug and checkout, in field test and support, in card repair, etc.

The test capability described here is typically not intended to replace a multimillion-dollar test system, but to enable verification of correct operation of all components on the card and to support maintenance and debugging functions when needed.

Overview of MDC 110

In some embodiments, MDC 110 includes two major kinds of components: a single ASIC called W-chip 120 (other embodiments include a plurality of chips that together provide the function for such a W-chip 120), and a plurality of (e.g., twenty, in some embodiments) DDR2 (double-data-rate type two) memory-chip groups 130 (or, in other embodiments, other types or mixes of types of memory components 130). In some embodiments, there are multiple less-complex components, generally capacitors.

Clock signals 222 (there are two required, in some embodiments) are supplied through the card connector using differential signaling.

As shown in FIG. 1A, a block diagram of MDC 110, and in FIG. 3A, which shows a lower-level diagram of the W-chip internals, the W-chip 120 has several functions that include:

Four DDR2 memory controllers 127 supporting 333/667 MHz data rates to the memory. In the computer system 100 architecture each controller and its associated memory components is known as a memory subsection. Some features of the memory controllers that are important for testing are described below.

Four high speed (five to eight GHz signal rates, differential, for some embodiments) interface ports 121 that support full duplex operation. All normal references, commands and data go through these ports 121. In some embodiments, the nominal/expected data rate is 5.6 Gbps, or in other embodiments, other multi-Gigahertz speeds. In some embodiments, each port can have two or more parallel paths for increased data throughput.

In some embodiments, 512 KBytes of L3 cache implemented in four blocks (called quadrants) of 128 KB. Each quadrant is associated with one of the subsection memory controllers 127 such that the controller handles all 'miss' traffic for that cache block. Within the cache logic are functions that support data sharing and coherency for data in the cache and in higher level (L1, L2) caches of the processors connected to the interface ports 121.

A 4-by-4 crossbar 123 that connects the four high speed ports 121 to the cache quadrants 124 and respective memory subsections (each having a memory controller 127 and its memory chips 130).

A test engine 125 that generates tests for the memory subsections and for the other paths and functions of MDC 110/W-chip 120. Test engine 125 can check read data and capture some read-data results. Test engine 125, along with other test and maintenance features designed into the logic make for a fairly complete, standalone, test capability.

In addition, two MDCs 110 can be connected together such that one MDC 110 can be used to provide test data and test sequences for the other MDC 110.

In some embodiments, the W-chip test engine 125, other maintenance functions, and other status and control aspects of MDC 110 and W-chip 120 are accessed through a JTAG port 122 (Joint Test Action Group, IEEE Std. 1149.1) that is available at the card connector pins. In other embodiments, Firewire channel is provided and connected as the external interface to the MDC 110, and is internally connected to the JTAG control interface 122.

In some embodiments, each DRAM controller 127 drives five memory parts 130, each being eight-bits wide, and thus has a 40-bit data interface. In some embodiments, a second rank of five parts 130 is also supported. In other embodiments, multiple ranks of chips are provided, with a separate chip select per rank. This needs only one additional chip-select signal output from each memory controller 127 for each memory rank in the chip-group stacks since, if the two-rank capability is implemented, memory chips are, in some embodiments, connected as five stacks of two memory parts each with almost all pins shared in each stack.

In operation, each 40-bit data interface is used as thirty-two data bits, seven SECDED (single-bit error correction, double-bit error detection) checkbyte bits and an active spare bit. When being tested, memory can be accessed like that or alternatively or additionally can be exercised as a simple 40-bit interface.

Test Overview

A basic feature for the test design of MDC 110 is that the card is testable with almost no support needed externally, except for connection to a controlling JTAG (or Firewire or other similar or suitable channel) interface, two clock sources, and some routing on the connector that provides power in addition to connections to the clocks and maintenance wiring, at a minimum. In an MDC 110 testing environment, wiring for interface port loopback tests should be provided, for example as shown in FIG. 2B. In some embodiments, the SerDes interface logic is largely self-testing as is shown in FIG. 2D. The W-chip Test Engine (WTE) 125 provides for complete testability of the all chip functions (including the SerDes interfaces if needed) but the L3 cache, the memory subsections, and the remainder of the chip have significant built-in functional checking that is very useful in MDC 110 testing. For example, in some embodiments, both the cache and the memory subsections have SECDED data checking, the cache-coherency logic flags erroneous sequences, etc.

The test design will also support using one MDC 110 to test another. Doing this means a more complex test fixture in order to have the pair of cards connected together, for example as shown in FIG. 2A. The result is that memory cards are testable without the need to interface a logic or memory tester to the high-speed ports 121. This operation mode still requires use of the JTAG interfaces of both cards to control and status the test operations. When the cards are connected together, data on one card is used to test the other. In some embodiments, the card-to-card test will stress full memory bandwidth.

Software support is required to drive the JTAG interface and to make use of the test capabilities of the card. In some embodiments, an interface is provided between a standard channel such a Firewire, IEEE Std. 1394 and the JTAG pins of W-chip 120 because a connection is required to a maintenance or control processor 220 will, in some embodiments, require the interface chip for operation and maintenance of computer system 100.

In some embodiments, loopback connections for the high-speed ports 121 using the test fixture enable the ports 121 to be tested at full data rates without test or tester connections to the ports 121. The port interface transmitters and receivers automatically synchronize together and then pass test data back and forth as part of each port's initialization sequence, indicating that each port is ready for use. In addition, the WTE can generate and receive test operands for the interface ports 121 using the test fixture's loopback wiring. These tests can use test-specified or pseudo-random data patterns. The same test sequences can be done using an internal loopback capability at each port's IO pads (See FIG. 2D) but that does not exercise that portion of the board wiring or edge connector pins.

In some embodiments, the WTE is a basic microcode sequencer that is designed to generate requests and accept responses from the internal logic and memory functions and can check the returned data. The sequencer is loaded with tests consisting of commands, address sequences (including looping capabilities), test data and expected result data according to the needs of the test to be performed. The test engine 125 is very flexible so that a diagnostic or test engineer can directly specify needed test functions and sequences. Test sequences of almost unlimited lengths can be generated.

In some embodiments, the test data width is controllable so that data functions with and without accompanying SECDED ECC can be tested easily. The WTE also can generate tests with pseudo-random numbers and check the results of tests using that data. The number of different test-data operands and expected-data results are typically bound by buffer size limits.

The L3 cache can be tested specifically by the test engine 125 and can be used to help test the DRAM memory subsections. When testing the subsections, test data can be placed into the cache through the JTAG port or can be written to the cache by the WTE. A test sequence in the WTE can then generate requests to the cache that cause cache data to be written to the subsection memory. Subsequent WTE requests can cause that data to be read and checked. The benefit of doing this, as the cache is small with respect to the memory in each subsection, is that full memory bandwidths can be generated so as to check for data and timing interactions and for other transient issues.

Each of the logic functions in W-chip 120 chip has several associated MMRs (Memory Mapped Registers). The registers control and configure the respective logic. Also, if a function has status (such as a memory controller 127 provides information on SECDED errors), that information is recorded in local MMRs. All MMRs can be accessed and controlled through the JTAG interface.

Some errors detected by normal logic functions can indicate the need for support, recovery or reconfiguration by the operating system or maintenance processor, for those cases data packets can be generated by the normal logic functions that become interrupt requests in normal system operation and can provide expected interaction that helps verify correct operation of MDC 110 functions. All interrupts can be enabled and disabled by setting control bits in MMRs.

In normal use, system data paths are 64 data-bits wide and are considered as having a single 8-byte data item or two 32-bit data items. At the memory, the data path is 40-bits wide to support 32-bit data items, ECC (the error correction code data) and the spare-memory-bit path. In some embodiments, in order to enable full testing of the memory chips, all needed paths in W-chip 120 support 40- and 80-bit data widths.

Of course the high-speed processor ports 121 are narrower—four bits in each direction for some embodiments. However, the SerDes assembly/disassembly process allows for interface data packet elements (called flits in packet parlance) to support data that is 32- and 64-bits wide. In addition, the interface supports 40-bit wide data elements in test mode, in which 40 of the 64-bit data items hold test data.

Functions of the Memory Controllers 127 that Affect Test and Maintenance

A simplification for some embodiments of the controller 127 is that individual byte-enables are not used. For those cases, at each data strobe, all 40 data bits are used or they are all skipped. Also, in some embodiments, there are no power-down or sleep modes supported in memory and there are no chip self- or auto-refresh functions. Each controller 127 generates distributed refresh functions using normal memory references and uses the returned data to accomplish background memory scrubbing. (If the refresh data has an error, a memory write cycle is scheduled to put correct data back in memory, if that is possible for those embodiments.

For some embodiments, each memory controller 127 can only accept memory requests that result in 16-byte/burst-of-four or 32-byte/burst-of-eight data transfers to/from memory. All references close the banks in the memory parts at the completion of that operation for those embodiments. In some embodiments, there is one maintenance case where one MDC 110 is being used to source test sequences to another card in which whole rows from the memory banks are transferred. This function is typically not used in normal system operation.

The same logic that detects and fixes data being scrubbed can be used to rewrite correct data back to memory when a correctable error occurs during normal user operation, in some embodiments. (Most systems using SECDED or more powerful error correction schemes fix the data being returned to a user but leave the data bad in memory. This can accumulate soft errors in memory and result in multi-bit, uncorrectable errors.)

For some embodiments, each controller has 7-bit SECDED and an active spare bit along with the normal data path of 32 bits. In test mode either 32-bit (letting the controller control the other eight bits), or 40-bit data can be written and read. In 32-bit mode, checkbytes are generated and checked and the position of a data bit to be replaced by the spare data-bit can be specified. The WTE can exercise and test this logic.

For some embodiments, each controller is designed to maximize memory bandwidth by allowing memory requests to go out of order and by grouping read and write operations such that bus turn-around losses are reduced. The reordering takes place with respect to the memory banks of the memory chips so that multiple requests for the same bank stay in order. If the oldest request is for bank 0, but that bank is busy, use a following request to start another memory operation for a bank that is not busy. The reordering function can not be turned off in some embodiments, but can be controlled and used by specifying what address sequences are generated when generating address sequences for testing. The test engine 125 can check returned data without being dependent on data ordering. Each memory request has a transaction identifier (TID) that is used to establish correspondence between particular requests and data being returned in response to the requests by returning the TID with the corresponding returned data items.

Each controller can be driven directly from the JTAG interface for a more direct memory access though this capability does not support test at high data rate (in some embodiments, 4 MBytes/sec or so).

The spare bit capability mentioned above allows an otherwise unused bit in the data path to memory to substitute for any of the other bits. Thus the memory interface is functionally 39 bits wide and the 40th bit can be used in place of any of the other 39. It is expected that the spare will generally be used to avoid 'stuck' bits in memory though it is also useful for some failures like broken nets and pins and similar faults.

In some embodiments, there is a 'memory degrade' option that allows system operation to be restarted in the presence of failing memory components. When the degrade option is activated, two of the four memory controllers 127 support all four L3 cache quadrants. The degrade option allows either the even or odd numbered controllers to be used, with the other pair idled. This reduces the memory size and the memory bandwidth by half but allows users to continue to use the processors whose associated memory has failures. The degrade paths must be tested as part of the verification testing of MDC 110.

The controller design supports multiple memory-chip densities and various memory timing and functional variations, in some embodiments. These functions and modes are controlled by on-chip registers and can be exercised and tested by the test engine as desired. The memory controller, in some embodiments, also supports multiple different kinds of atomic memory operations (AMOs) like add-to-memory functions for example. These read-modify-write functions can also be exercised and tested by the test engine.

Test and Maintenance Functions of the Processor Ports 121

In some embodiments, when a SerDes receiver (SerDes-in 341 portion of a port 121) is powered up or when the receiver loses link synchronization, the receiver automatically goes into a 'training' mode where it expects to receive a timing sequence so that clock and frame sync can be established or recovered. When the output logic of a SerDes port 121 is initialized, each bit-serial driver puts out a data sequence that enables the corresponding receive logic to acquire both clock and frame synchronization. After the frame-sync interval, a test-data sequence is generated and processed to verify each link's functionality. If that sequence is done correctly the receiver becomes ready to accept normal data traffic.

In order for things to remain in sync, each output constantly sends data packets. If there is no port information to be transmitted at the time each packet is sent, a null packet is formed and transmitted. Status in both the transmitter and receiver indicate how things are going. This means that, for example, if a net or connector breaks, reading the status MMR of the receiver indicates that the receiver has dropped out of clock sync and is not detecting any input.

In normal use data is 'packetized' to enable detection and recovery from errors. Each packet has ECC for data checking and has a packet ID so that error packets can be identified. As packets are received the ECC is checked. If all packets in a frame are received correctly, an acknowledgement is passed back to the transmitter. This enables the transmitter to keep sending more packets. There is a maximum number of packets that can be sent without being acknowledged. If an error is detected, no acknowledgement is returned. The transmitter will time out (in some embodiments, the timing is adjustable) and, by knowing the last frame that was successfully received at the other end, will start retransmitting the failed frame packets. Status is kept and another MMR has a limit on the number of retries that will be attempted before giving up.

There are some other test functions that test that the packet error checking and packet retry functions work correctly. The functions are, in some embodiments, able to be controlled directly from on-chip MMRs and so do not require the WTE, though the test engine 125 can provide additional testing, if desired.

In some embodiments, any errors detected in the SerDes interface and in checking the packet data are recorded in status MMRs and are available at all times.

As was stated before, in some embodiments, logic associated with each SerDes port (the LCB or Link Control Block) can generate a pseudo-random data sequence that can be sent and checked at the receiver. This is normally done as part of the initialization sequence. This means that, in some embodiments, no additional direct test capability is needed from the WTE or from other tests specifically directed at the interface ports. Of course the ports will be exercised by data passing through the ports, as when one memory card is being used to test another card. Error checking and recovery is enabled and used for these cases.

The transmit/output and receive/input sides of each SerDes port are independent enough that a single loopback connection can verify functionality using the functions discussed above. There is a maintenance function to activate this loopback connection at the pins of W-chip 120.

Test and Maintenance Functions for the L3 Cache and Associated Logic

In some embodiments, the L3 data cache has SECDED circuitry on a 32-bit basis. Like the DRAM interface, data can be written and read in this mode and also in a 40-bit mode so that the memory underneath the data checkbytes can be easily tested. This would normally require that the cache support 39 bits, but 40 bits of data width are provided so that the data items in the cache can be used as full-width test operands for the memory subsections.

Associated with each cache line (32 bytes per cache line, in some embodiments) is an address. The address is used when memory requests arrive from the processors to see if the requested data item is present in the cache so that a subsection memory reference can be avoided. The addresses for all the cache lines are grouped together into a Tag RAM. Each entry in the Tag RAM is the address for the data of one cache line. In addition to the address data in the Tag RAM, sharing and coherency state data for each line is also stored. This information is used to determine data 'ownership' and sharing properties.

In some embodiments, the Tag RAM is protected by its own SECDED checkbyte. The logic and memory associated with the checkbyte are not directly testable but have a maintenance function, discussed below, that enables full test of the associated functionality. The coherency logic is tested with specific test sequences from the WTE. Built into the coherency logic are illegal sequence detectors (like trying to evict the same item twice in succession) that help in the testing of these functions, in some embodiments.

The 'way-compare' logic in the cache (in some embodiments, sixteen comparators that see if a request address matches one of the addresses in the Tag RAM) is tested by storing specific addresses in the Tag RAM and then generating a memory request (usually from the WTE) and seeing if data is returned from the cache or if a memory-get request is generated to the memory controller 127 (indicating that no address match was found).

Each quadrant of the L3 data cache is 'more or less' testable as a random-access memory when put into a specific test mode. At the same time and using the same test mode, the other sharing and coherency logic is driven by the same sequence (read and write operations) and sends responses to the WTE for checking. The 'more or less' comes from the fact that the multiple cache entries at a single address index (the 'sixteen ways') are distinguished by the requirement that the address in each respective Tag entry must be different and the way-compare logic indicates that a particular 'way' has the data cached for a particular address and self identifies. In some embodiments, there is no mechanism to say "read the data item that resides in 'way-3' for the following address/index." In a test mode the individual ways can be identified, but again, without knowing a 'real memory address.' In some embodiments, from the WTE, data can be written to specific ways and memory indexes; this is equivalent to having a memory address. When data is being read from the cache, the address compare logic chooses a way that matches the requested address and returns the correct data without ever having a specific read address. In some embodiments, the JTAG path can read and write specific cache locations but at a lower bandwidth than can be sustained by the WTE.

Testing of the SECDED checkbyte generation, memory, syndrome generation, and data correction functions of the Tag RAM are accomplished with the following test:

The storing of a checkbyte value in Tag RAM when an entry is to be written can be blocked. The resulting zero checkbyte value is the same as if the data entry being stored is all-zero. In other embodiments, a non-zero checkbyte value is used for all-zero data items, in order that a failure that causes all bits to be zero will be detected. For those embodiments, that non-zero checkbyte value is forced rather than the all-zero value.

Store a set of single sliding-one bit values into the Tag RAM. As each entry is read back the returned value should be all-zeros and the status MMRs will indicate the bit position of the 1-bit that was stored. Data values to cause other single- and multiple-bit errors can be stored and read in order to fully check the read checkbyte, syndrome, and correction logic. Depending on the likely faults (failure modes that are more probable than others), a sliding-zero sequence is used for some embodiments.

Once the read checkbyte logic is verified, the write logic must be working if no errors are reported in normal and test operations.

The cache is also used in testing the DRAM memory. When this is done, data to be written to the DRAMs is stored in the cache. The WTE generates AMO (or other) references that cause data to be written to the DRAMs in the associated subsection. Data can be subsequently read by having the WTE generate normal memory reads for the same addresses. In some embodiments, using AMO (atomic memory operation) references allows full memory bandwidth to be generated and does not require that the detailed structure of the cache be understood in order to generate useful test sequences. (By way of explanation: in some embodiments, AMO operations take place in each memory controller 127; any cache data must be forwarded to the controller so that can take place. The memory controller 127 writes the data to memory as part of AMO functionality.)

Other Test and Maintenance Functions

In some embodiments, the W-chip 120 has a capable internal test-point monitoring capability. Commands are sent to the logic monitor to choose what test points to monitor and to select a triggering condition. The selected testpoint data is saved in a buffer memory for observation later.

The trigger condition can start or stop data recording. If the trigger condition mode stops testpoint data recording, data recording is started when the mode is selected and runs continuously—the testpoint data buffer is circular—and is stopped when the trigger condition occurs. As a result, data in the testpoint buffer looks backward in time as the condition that generated the trigger condition corresponds to the last entry in the buffer. If the trigger condition mode is to start recording testpoint data, than data recording is started when the trigger condition occurs and is stopped when the buffer is full. Data in the buffer is then later in time than the triggering event. This capability has proved very useful for low-level debugging and fault-finding.

The JTAG scan logic has full access to all memory-mapped registers which hold configuration information and control and receive status from all major logic functions in the IC. This includes system level operations as well as maintenance and diagnostic functions.

Functions of the W-Chip Test Engine 125

The WTE (W-chip test engine) 125 is connected into the chip's logic as shown in FIG. 3A. It has access to all data coming into and leaving the chip both from the processor ports and from the memory subsections. The test engine 125 is used to generate tests and to check results when testing the L3 cache and coherency logic and when testing the memory controllers 127 and the DRAM parts 130. The test engine 125 is used to provide address generation when one MDC 110 is testing another and is used, in some embodiments, in the card being tested to check test results. In addition, for some embodiments, the WTE can be used to generate tests for, and to observe results of testing the high-speed ports 121 when the ports are configured in any of the various loopback functions or modes.

The test engine 125 is controlled and results observed through MMR registers that are accessed through the JTAG port. In addition, in some embodiments, the test engine 125 can be used in other system test operations, for example by generating test data packets that can be sent to the processors for diagnostic functions.

The logic of the test engine 125 consists of two major components: a sequencer 346 (e.g., one that is controlled by microcode stored in the W-chip) which generates tests and a result test checker 347. A block diagram of the sequencer is shown in FIG. 3B.

In some embodiments, the Test Generation logic has the following major features and subcomponents:

- A small (in some embodiments, 32 entries are provided Test-Data memory buffer. Entries are used as the data source for data being written to memory, to the cache, and for test data needed for testing of any other logic functions. Data in this memory is written to the buffer memory by using the JTAG path as part of entering a test sequence into the test engine 125. In some embodiments, the capability is provided to specify that the complement of the data in the buffer should be used instead of specified stored test operand.
- In some embodiments, one or more memory-address generators (e.g., one or two) have separate portions for row, column, and bank. The register holding the current address can be entered whole or can have any of the 3 portions incremented/decremented by a small bit field. The idea is to specify increments from a last value starting from some fixed address. This avoids the requirement for a loader function (to relocate addresses for different memories or when executing a test sequence from a different starting point than the original address). Doing this also will greatly reduce the number of entries in the microcode memory and so reduce time to load test sequences. The address generator function is also used when testing the L3 cache.
- One or two loop counters are provided for some embodiments. A bit from the microcode control memory indicates to decrement a counter. If the count is zero the next command is the next sequential entry in the sequence memory. If not zero, the entry in a 'loop back' field in the microcode memory is used to adjust the address of the next entry taken from the sequence memory. (This field should be a relative offset also.) The loop counters can be loaded as needed from the microcode memory.
- A microcode memory (in some embodiments, for example, fifty bits in width by 256 addresses). The contents of each data entry consist of several fields, each of which control some specific function or data item.
    A. One or more bits to indicate that the loop counter(s) 314 should be decremented and tested.
    B. A 'Loop Back' field (in some embodiments, four bits) to indicate address offset for top of loop address.
    C. Three fields to indicate how the current row, column, and bank address should be adjusted for the memory reference that will be made following the current reference. These fields will likely have additional functions of holding a memory address to be loaded and as loop counts.
    D. A small microcode command field that indicates that the current sequence entry is used to load the address or loop counters directly, so that the sequence fields become catenated and an immediate value. 'Halt' is likely one of the commands.
    E. A memory command field (in some embodiments, six bits) that is the memory function specification: read, write, AMO, and some of the parameter bits (allocate/no-allocate, exclusive/shared, etc.)

When the WTE is running a test, the different registers needed for the test and the contents of some of the fields in the sequence memory are used to build a request packet—write at the following address using a specified data item from the test data buffer, for example—and sent off for execution. Each packet is given an identifier, called a TID (for Transaction IDentifier), that is most importantly used when data is returned as a result of a data read request. The Result logic keeps a pointer to the expected data in association with the TID. This means that data checking is not dependant on the order that data is returned from memory.

The Test Result logic is shown in FIG. 4. It has a Expected Result buffer memory to hold data that are used to compare with test data being returned from the logic or memory function being tested. In some embodiments, there is also a small (in some embodiments, one KByte) memory buffer that can save test results for external observation as needed.

All the needed 'meta' controls for the WTE test functions—indicating, for example, to the crossbar logic that 40/80-bit data paths are required instead of 32/64-bit paths or that the test sequence is for the L3 cache rather then the DRAM memories—are MMRs that are controlled via the JTAG scan logic.

The WTE also has the ability to generate requests to the memory subsection controllers that result in a stream of data being dumped to the processor ports. The data stream becomes a sequence of memory read and write requests to a connected unit-under-test. A test mode set in the memory controllers 127 causes whole memory rows to be read at maximum bandwidth. This function is used on the Gold unit when it is generating test streams for use in testing another MDC 110.

Among several other functions that can be useful in support of system operation, debugging, or checkout, it is, in some embodiments, very easy for the WTE to change the ECC checkbytes in memory in the following ways: 1) pass through memory making the data checkbytes correspond to data stored there and 2) pass through memory storing invalid checkbyte values. The first function allows corrupt memory to be accessed and the second is intended to generate an interrupt when a program accesses data that has not been subsequently validly initialized; this is useful in software program debugging.

The test engine can also be used, in some embodiments, in normal system operation, for example by zeroing-out newly allocated memory pages as a help to operating system allocation routines.

Using One MDC 110 to Test Another

When one MDC 110 tests another, one card (the golden unit) is a master and is used to provide a stream of requests to the MDC unit under test. The following is done:

- Data is stored into any or all of the memory subsections of the gold unit that correspond to subsections of the unit-under-test that are to be exercised using the JTAG path to provide the data in preferred embodiments.
- The unit-under-test is configured for normal operation, except that read-data checking and data path widths are enabled as needed. Also, the Expected Data buffer is loaded so that data checking can be performed.
- The WTE in the gold unit is given a starting address and an address range/length. The WTE generates incrementing, full row read requests so that ordering within the resulting data stream is fully deterministic. The crossbar logic sends the requests to any identified quadrant and subsection that is to be tested resulting in a data stream at each port corresponding to the memory subsections that are to be exercised. In some embodiments, the memory references are broadcast to all memory controllers 127 at the same time to exercise the UUT more completely and at higher total bandwidth.
- The streams coming into the unit-under-test see are seen as a series of read and write requests that are executed. In general, each stream's addresses should be restricted so that each port's requests do not get sent to a different subsection than that of the requesting port number. The issue here is not that the read or write operations will not be done correctly but that the ordering of operations can change because of interactions between the multiple requesting streams. (Each interface port is separately re-synced to the memory and logic clock by the SerDes logic. This generally makes ordering of one data stream with respect to another nondeterministic.) Some read data can be saved in the WTE result buffer and observed externally if needed, though result data reordering must be considered in observing the data returned, in some embodiments.
- The Test-Result portion of the WTE of the unit-under-test is used to check that data read from the memory of that unit is correct. This means that the Expected Result data buffer must be loaded through JTAG scan path before the test starts. The Build Test Packet logic of the WTE test generation function is used to scan the request data stream from the gold unit to enable association of read requests to the contents of the Expected Result buffer. Note that, in some embodiments, none of the data read back from the memory of the unit-under-test leaves that unit while the test is underway, though some embodiments might well pass the data back to the gold unit for testing.

In this mode, the memory controllers 127 always reference and send out whole rows from the memory. If the test ends before the last data in a row, the test data generator must pad the end of the sequence with null/empty packets, in some embodiments.

The request data stored in the memory of the gold unit must be properly formatted data packets. In some embodiments, data within the test sequence can be normal 32- and 64-bit data or it can provide 40-bit data items in the data portion of the request packets. For some embodiments, a single test stream must not mix 32/64 bit data requests with 40-bit data requests. The 40-bit data format allows memory normally holding ECC data bits to be tested as normal memory with full control over the stored data bits. This 40-bit mode will not exercise full memory bandwidth however, in some embodiments. When in 40-bit mode, all memory requests must be for 16-byte data items (a single burst-of-four for each memory subsection when using DDR2 SDRAM memory), in some embodiments.

About the Memory Mapped Registers (MMRS) in W-Chip 120

All MMRs are loaded and unloaded through the JTAG scan path, in some embodiments. All control functions including master clear and initialization functions are done through on-chip MMRs. Internal status for all functions is available in the requisite MMRs. The internal memory blocks including the L3 data and Tag/coherency memories and the test point buffer can be written and read through the MMR access mechanism.

Each MMR or memory function is assigned an address or an address range. In the JTAG scan port there is a register that can be loaded with the needed address; there is also a function register is that is loaded at the same time. If the function is writing, data follows the address in the serial data stream. If the function is reading, the data from the addressed entity is driven from the scan output. The result is quick access to any needed function, status register, or data memory and avoidance of long scan chains when accessing the MMR functions. When the IC is powered up or is given the lowest level of master clear, all MMRs are loaded with default values, in some embodiments. While some of the defaults will likely never change except for some of the maintenance functions (enable coherency in the L3 cache, for example), others will become obsolete and will always change; for example, when 4-Gbit memory parts become available the memory size default for 1-Gbit memory parts will, in some embodiments, never be used on new systems from that point onward. For some embodiments, the scan port in W-chip 120 can run at any frequency from dc to 50 MHz.

Using the Test Functions in MDC 110/W-Chip 120

In some embodiments, test sequences will follow the same basic operational steps:

- A. Load needed MMRs for needed configuration functions: Any configuration difference from the default or current state is loaded at this time. This can include disabling ports or other functions as needed.
- B. Load and control MMRs for needed initialization or training: The SerDes ports must go through an initialization sequence. Similarly, there will be clock timing adjustments or driver impedances that must be set in the memory controllers 127 and in the memory parts 130 themselves.
- C. Load any data needed into memory blocks that will source data or information for the test sequence: If the WTE is to be used, the microcode memory must be loaded and the Test Data Buffer and Result Data Buffers loaded. For some tests the L3 data and/or Tag memories must be loaded. When using one MDC 110 to test another, the memory of the 'gold' unit is loaded at this time.
- D. Start/execute the test: An MMR is written with a 'go test' signal such that the needed test is activated. In most cases the WTE starts running the test or there is similar capability in the other test functions.

E. Observe the test results: MMRs with result status are observed. In some cases result data memories or buffers must be unloaded and observed in some fashion.

F. If needed, repeat some or all of the above.

Some embodiments of the invention include a first circuit 120 for use with a first memory card 110, the card having a plurality of memory chips 130. This first circuit includes a high-speed external card interface 112 (also called a system interface 112) connected to write and read data to and from the memory chips 130, and a test engine 125 configured to control the high-speed interface 112 and/or the memory chips 130 and to provide testing functions to a second substantially identical circuit 120 on a second memory card 110.

Some embodiments of the first circuit 120 further include one or more memory controllers 127, each one of the one or more memory controllers 127 connected to control a subset of the plurality of memory chips 130.

Some embodiments of the first circuit 120 further include one or more caches 124; each one of the one or more caches 124 operatively coupled to a corresponding one of the memory controllers 127.

In some embodiments of the first circuit 120, the high-speed external card interface 112 further includes a crossbar switch 123, and one or more SerDes ports 121, each one of the one or more SerDes ports 121 connectable through the crossbar switch 123 to a plurality of the caches 124.

Some embodiments of the first circuit 120 further include a control interface 122, the control interface configured to program the test engine and to initialize, control, and observe test sequences.

In some embodiments, the invention includes a system 200 for using a first memory card 110 to test a second memory card 110, the system 200 including a test fixture 210 having a first interface 219A connectable to the first memory card and a second interface 219B connectable to the second memory card, such that at least some inputs from the first interface are connected to corresponding outputs of the second interface, and at least some outputs from the first interface are connected (via connection wiring 230) to corresponding inputs of the second interface, and a test controller 220 operable to send configuration data to the first interface to cause a testing function to be performed when suitable first and second memory cards are connected to the fixture.

In some embodiments, the first interface connects each of one or more high-speed SerDes port of the first memory card 110 to a corresponding SerDes port of the second card 110.

In some embodiments, the test controller 220 receives test results from the first memory card 110 indicative of functionality of the second memory card 110.

In some embodiments, the test controller 220 includes an interface 219 (or 219A and 219B) to send and receive data from respective control interface ports 119 of the control interfaces 122 on the first memory card 110 and the second memory card 110.

In some embodiments, the test controller 220 is operable to configure the second memory card 110 to each one of a plurality of different operation modes.

Some embodiments of the test system 200 further include a test controller connection 219 to both the first and second memory cards.

In some embodiments, the invention includes a method for testing memory cards, the method including connecting a plurality of interface lines of a first memory card to corresponding complementary interface lines of a second memory card, configuring the first memory card to be operable to perform testing functions, configuring the second memory card to be operable to perform normal read and write operations, and testing the second memory card under the control of the first memory card.

In some embodiments of this method, the configuring of the first memory card includes loading microcode into the first memory card.

In some embodiments, the invention includes a first memory card 110 that includes a plurality of memory chips 130, one or more high-speed external card interfaces 121, including a first interface 121 and a second interface 121, each connected to write and read data to and from the memory chips 130, and a test engine 125 configured to control the first high-speed interface 121 and the memory chips 130 in order to provide testing functions to the second high-speed interface 121.

In some embodiments of this card 110, the test engine 125 is operable to generate requests that look like and perform as normal requests to the card.

In some embodiments of this card 110, the test engine 125 includes internal paths that enable the test engine 125 to send requests to and receive results from a plurality of internal chip functions.

Some embodiments of this card further include circuitry that allows results to return in a different order than the order in which they were generated.

Some embodiments of this card further include a microcode memory that stores code that controls at least some functions of the test engine.

In some embodiments, the invention includes a computer system 100 or 200 that includes a first processing unit 106 or 220, and the first memory card 110 described above, operatively coupled to the first processing unit 106 or 220.

Some embodiments of this computer system 100 or 200 further include a second memory card 110 substantially identical to the first memory card 110, and operatively coupled to the first processing unit 106 or 220.

In some embodiments of the computer system 200, at least one interface port 121 of the first memory card 110 is complementarily connected to a respective interface port 121 of the second memory card 110, and wherein the first processing unit 220 is configured to load configuration information into the first memory card to cause the first memory card 110 to perform test functions to the second memory card 110, the first processing unit 220 also configured to receive test results.

In some embodiments of the computer system 100, the first processing unit 106 is configured to load configuration information into the first memory card 110 and the second memory card 110 to cause the first memory card 110 and second memory card 110 to perform normal read and write operations.

Some embodiment further include a second processing unit 106, a third memory card 110 substantially identical to the first memory card 110, and operatively coupled to the second processing unit 106, and a fourth memory card 110 substantially identical to the first memory card 110, and operatively coupled to the second processing unit 106.

Other embodiments of the invention include a first memory card 110 that includes a plurality of memory chips 130, a high-speed external card interface 112 connected to write and read data to and from the memory chips 130, and a test engine 125 configured to control the high-speed interface 112 and/or the memory chips 130 in order to provide testing functions to a second substantially identical memory card 110.

Some embodiments of card 110 further include one or more memory controllers 127, each one of the one or more memory controllers 127 connected to control a subset of the plurality of memory chips 130.

Some embodiments of card 110 further include one or more caches 124; each one of the one or more caches 124 operatively coupled to a corresponding one of the memory controllers 127.

In some embodiments of card 110, the high-speed external card interface 112 further includes a crossbar switch, one or more SerDes ports, each one of the one or more SerDes ports connectable through the crossbar switch to a plurality of the caches.

Some embodiments of the first memory card 110 further include a control interface, the control interface configured to program the test engine and to initialize, control, and observe test sequences.

Another aspect of the invention in some embodiments provides a single-chip memory-support circuit 120 that includes a system interface 112, a memory interface 113 operable to generate read and write operations to a memory 130, wherein the circuit 120 operates to provide data from the memory interface 113 to the system interface 112, and a test engine 125 operatively coupled to control the system interface 112 and the memory interface 113 in order to provide testing functions. In some embodiments, the testing functions are programmably configurable, i.e., they can be controlled by information that is loadable into the test engine. Since this control information is loadable, it can be changed to enable testing of various conditions that perhaps could not be anticipated early in the design phase.

Some embodiments of card 110 further include a control interface 122, wherein testing configuration information is loadable through the control interface 122 into the test engine 125 to provide the programmably configurable testing functions.

Some embodiments of card 110 further include a cache operatively coupled to the memory interface and the system interface to provide cached data to the system interface.

In some embodiments, the test engine includes a test-generation function; and a test-result-checking function, wherein results can be returned and checked in an order different than the order in which they were generated.

Another aspect of the invention in some embodiments provides a integrated-circuit chip that includes an input-output port; and a test engine operatively coupled to control the input/output port such that functionality of the input/output port can be tested by connecting the input/output port to a similar port of another chip and sending test commands to and receiving test results from the other chip's port.

In some embodiments of this chip, the testing can be performed without regard to the electrical and architectural implementation of the ports.

Some embodiments of this chip further include a memory interface operable to generate read and write operations to a memory, wherein the circuit operates to provide data from the memory interface into the input/output port.

Some embodiments of this chip further include a control interface, wherein testing configuration information is loadable through the control interface into the test engine to provide testing functions.

Some embodiments of this chip further include a cache operatively coupled to the memory interface and the input/output port to provide cached data to the input/output port.

Some embodiments of this chip further include functional logic on the chip; wherein use of the test engine is independent of operation of the functional logic.

Some embodiments of this chip further include functional logic on the chip; wherein use of the test engine is independent of and tests operation of the functional logic.

In some embodiments, the test engine generates a plurality of tests in order that two or more simultaneous functions of the functional logic are tested at the same time. For example, testing cache and causing heavy memory traffic, by requesting lots of data that is not in the cache, which in turn causes additional memory operations to fill the cache. In some embodiments, the WTE 125 can stimulate the crossbar 123 with a broadcast function requesting, for example, four pieces of data simultaneously. In some embodiments, the results checker 347 provides simultaneous checking of up to four results.

In some embodiments, various functions provided by the test engine are also used in normal operation. For example, the test engine provides a fast, efficient, and easily programmed way to provide additional functionality to the MDC 110 for normal operation, such as the ability to zero a block of data, or to fill data patterns that are recognizable as invalid data (such functions could be, but need not be, associated with allocation of memory blocks). In some embodiments, a user requests the operating system (OS) (e.g., of processor 106 of FIG. 1A) to give the user additional memory space (e.g., allocate data for a memory page request), and the OS returns with a pointer (an address) to the data for the user, and the OS has initialized, or has arranged to have the hardware initialize, that data area to zero. In some embodiments, the WTE 125 is programmed to perform the zeroing of the block of allocated memory upon receiving the proper command from the OS.

The WTE 125 is also useful for debugging, in some embodiments. For example, the user sees that some program is making a memory reference to an address that is considered out of bounds, and the program is crashing the operating system, but due to the large number of different programs that are multitasking in the computer system it is very difficult to tell which program is making the out-of-bounds memory request, or where in the program. Thus, in some embodiments, the WTE 125 is used to initialized some or all unused memory with a particular data pattern that is never validly usable by normal code (e.g., in a memory with SECDED error-correction code, this could be a pattern of all zeros in the normal 32-bit data field, and with a pattern of data in the field of error-correction bits (the seven or eight extra bits that are used for error correction) that indicates a two-or-more-bit uncorrectable error). Upon receiving the command to initialize memory, WTE 125 would go through the memory-allocation block and initialize that piece of memory that is going out of bounds with the predetermined special data pattern (which gives an uncorrectable error indication when accessed as normal memory). Thus, when the user accesses that area (e.g., the area beyond the end of a defined array), they get a multiple-bit error due to the initialization done by WTE 125. When a user's program is exceeding the bounds of an array, the multiple-bit error pattern is read from past end of array, and the W-chip 120 recognizes and reports the "corrupt data."

In some embodiments, there is an interrupt generated by the W-chip 120 for multiple-bit errors that are detected. In some embodiments, each memory controller 127 performs SECDED error correction (generates the ECC bits on data being written, and checks and corrects correctable errors, and reports uncorrectable errors). WTE 125 can cause writes of 40-bit data (of any arbitrary pattern), rather than 32-bit data plus SECDED, as is written from the normal write if data from a system processor. In some embodiments, the interrupts to report errors go through the normal data path through the high-speed serial ports, and the error gets reported back by an interrupt-request packet to inform the OS that this or that error happened.

In some embodiments, all requests have TID (Transaction IDentifier) tags that are sent to MDC 110 with each request, and then when the data are retrieved, they are returned with the corresponding TID to identify to the processor which request this data belongs to. If an error is detected, the error return includes the corresponding TID, along with an error-reply flag (indicating an error in the request, MDC 110 unable to satisfy with the proper data). The OS is told which card and which memory controller 127 detected the error.

In some embodiments, another aspect of the invention provides a system for testing a first memory card. This system includes a test fixture having a first interface connectable to the first memory card, such that at least some inputs of the first interface are connected to corresponding outputs of the first interface, and a test controller operable to send test configuration data to the first interface to cause a testing function to be performed by the first memory card when connected to the fixture.

In some embodiments, the first interface connects one SerDes port of the first memory card to another SerDes port of the first memory card.

In some embodiments, the test controller receives test results from the first memory card indicative of functionality of the first memory card.

In some embodiments, the test controller includes an interface to send and receive data from a control interface port on the first memory card.

In some embodiments, the test controller is operable to configure the first memory card to each one of a plurality of different operation modes.

Some embodiments of the invention include a computer-readable medium (such as, for example, a CDROM, DVD, floppy diskette, hard disk drive, flash memory device, or network or internet connection connectable to supply instructions. The computer-readable medium includes instructions stored thereon for causing a suitably programmed information processing system to perform methods that implement any or all of the inventions and combinations described herein. In some embodiments, this computer-readable medium is connected or connectable to system 100 of FIG. 1.

In some embodiments, all of the memory 130 is implemented on a single chip. In some embodiments, all of the circuitry described for one or another of the embodiments of MDC 110 is implemented on a single chip.

It is to be understood that the above description is intended to be illustrative, and not restrictive. Although numerous characteristics and advantages of various embodiments as described herein have been set forth in the foregoing description, together with details of the structure and function of various embodiments, many other embodiments and changes to details will be apparent to those of skill in the art upon reviewing the above description. The scope of the invention should be, therefore, determined with reference to the appended claims, along with the full scope of equivalents to which such claims are entitled. In the appended claims, the terms "including" and "in which" are used as the plain-English equivalents of the respective terms "comprising" and "wherein," respectively. Moreover, the terms "first," "second," and "third," etc., are used merely as labels, and are not intended to impose numerical requirements on their objects.

What is claimed is:

1. A system for using a first memory card to test a second memory card, the system comprising:

a test fixture having a first interface connectable to the first memory card and a second interface connectable to the second memory card, such that at least some inputs from the first interface are connected to corresponding outputs of the second interface, and at least some outputs from the first interface are connected to corresponding inputs of the second interface such that the first memory card can perform write and read operations to the second memory card and the second memory card can perform write and read operations to the first memory card; and a test controller operable to send configuration data to the first interface to cause a memory-testing function to be performed by the first memory card when suitable first and second memory cards are connected to the fixture, wherein the memory-testing function is configured such that the first memory card sends a plurality of write memory operations and a plurality of read memory operations from the first memory card to the second memory card and the first memory card tests whether the memory operations completed successfully.

2. The system of claim 1, wherein the first interface connects a high-speed SerDes port of the first memory card to a corresponding SerDes port of the second card.

3. The system of claim 1, wherein the test controller receives test results from the first memory card indicative of functionality of the second memory card.

4. The system of claim 1, wherein the test controller includes an interface to send and receive data from respective control interface ports on the first memory card and the second memory card.

5. The system of claim 1, wherein the test controller is operable to configure the second memory card to each one of a plurality of different operation modes.

6. The system of claim 1, further including a test controller connection to both the first and second memory cards.

7. The system of claim 1, wherein the test controller is operable to simultaneously control testing in more than one pair of memory cards, and wherein within each pair, one memory card is used to test the other memory card.

8. A method for testing memory cards, the method comprising:

connecting a plurality of interface lines of a first memory card to corresponding complementary interface lines of a second memory card such that the first memory card can perform write and read operations to the second memory card and the second memory card can perform write and read operations to the first memory card;

configuring the first memory card to be operable to perform testing functions;

configuring the second memory card to be operable to perform normal read and write operations; and testing the second memory card under the control of the first memory card by sending a plurality of write memory operations and a plurality of read memory operations from the first memory card to the second memory card and the first memory card testing whether the memory operations completed successfully.

9. The method of claim 8, wherein the configuring of the first memory card includes loading microcode into the first memory card.

10. The method of claim 8, wherein the first memory card includes a high-speed SerDes port, the second memory card includes a high-speed SerDes port, and wherein the testing includes sending serial commands and data from the SerDes port of the first memory card to the SerDes port of the second card.

11. The method of claim 8, further comprising sending test results from the first memory card to a test controller external to the first memory cards, the test results indicative of functionality of the second memory card.

12. The method of claim 11, further comprising:
sending control information from the test controller to respective control interface ports on the first memory card and the second memory card.

13. The method of claim 11, further comprising:
configuring the second memory card to each one of a plurality of different operation modes.

14. The method of claim 8, further including a test controller connection to both the first and second memory cards.

15. A non-transitory computer-readable medium having instructions stored thereon that cause a suitably programmed information-processing system to execute a method comprising:
connecting a plurality of interface lines of a first memory card to corresponding complementary interface lines of a second memory card such that the first memory card can perform write and read operations to the second memory card and the second memory card can perform write and read operations to the first memory card;
configuring the first memory card to be operable to perform testing functions on the second memory card;
configuring the second memory card to be operable to perform normal read and write operations; and
testing the second memory card under the control of the first memory card by sending a plurality of write memory operations and a plurality of read memory operations from the first memory card to the second memory card and the first memory card testing whether the memory operations completed successfully.

16. The medium of claim 15, wherein the medium further includes instructions to cause the configuring of the first memory card to include loading microcode into the first memory card.

17. The medium of claim 15, wherein the medium further includes instructions to cause sending of test results from the first memory card to a test controller external to the first memory cards, the test results indicative of functionality of the second memory card.

18. The medium of claim 15, wherein the medium further includes instructions to cause sending of control information from the test controller to respective control interface ports on the first memory card and the second memory card.

19. The medium of claim 15, wherein the medium further includes instructions to cause configuring of the second memory card to each one of a plurality of different operation modes.

20. An apparatus comprising:
a first memory card that includes:
a plurality of memory chips,
a high-speed external card interface connected to write and read data to and from the memory chips,
one or more memory controllers, each one of the one or more memory controllers connected to control a subset of the plurality of memory chips, and
one or more caches, each one of the one or more caches operatively coupled to a corresponding one of the memory controllers; and
a test engine configured to control the high-speed interface and/or the memory chips in order to provide testing functions to a second substantially identical memory card,
wherein the high-speed external card interface further comprises:
a crossbar switch; and
one or more SerDes ports, each one of the one or more SerDes ports connectable through the crossbar switch to a plurality of the caches.

\* \* \* \* \*